US010823943B2

(12) United States Patent
Zhang et al.

(10) Patent No.: US 10,823,943 B2
(45) Date of Patent: Nov. 3, 2020

(54) PLASMA SOURCE WITH LAMP HOUSE CORRECTION

(71) Applicant: KLA-Tencor Corporation, Milpitas, CA (US)

(72) Inventors: Shiyu Zhang, Fremont, CA (US); Ilya Bezel, Mountain View, CA (US)

(73) Assignee: KLA Corporation, Milpitas, CA (US)

( * ) Notice: Subject to any disclaimer, the term of this patent is extended or adjusted under 35 U.S.C. 154(b) by 172 days.

(21) Appl. No.: 16/165,842

(22) Filed: Oct. 19, 2018

(65) Prior Publication Data

US 2020/0041774 A1 Feb. 6, 2020

Related U.S. Application Data

(60) Provisional application No. 62/712,391, filed on Jul. 31, 2018.

(51) Int. Cl.
G02B 17/08 (2006.01)
G03F 7/20 (2006.01)
G01N 21/88 (2006.01)
G01N 21/21 (2006.01)

(52) U.S. Cl.
CPC ....... *G02B 17/0892* (2013.01); *G01N 21/211* (2013.01); *G01N 21/8806* (2013.01); *G03F 7/70225* (2013.01); *G01N 2021/213* (2013.01)

(58) Field of Classification Search
CPC ............ G02B 17/0892; G01N 21/211; G01N 21/8806; G01N 2021/213; G03F 7/70225
USPC ............................................ 250/493.1, 494.1
See application file for complete search history.

(56) References Cited

U.S. PATENT DOCUMENTS

| 5,608,526 | A | 3/1997 | Piwonka-Corle et al. |
| 5,999,310 | A | 12/1999 | Shafer et al. |
| 6,297,880 | B1 | 10/2001 | Rosencwaig et al. |
| 6,398,374 | B1 * | 6/2002 | Chapman ............ G03F 7/70075 359/364 |
| 7,525,649 | B1 | 4/2009 | Leong et al. |
| 8,618,254 | B2 | 12/2013 | Giaccia et al. |
| 2006/0238856 | A1 | 10/2006 | Shafer et al. |
| 2007/0002465 | A1 | 1/2007 | Chuang et al. |
| 2009/0180176 | A1 | 7/2009 | Armstrong et al. |
| 2014/0239192 | A1 * | 8/2014 | Schneider ............ G03F 7/2002 250/453.11 |
| 2015/0163893 | A1 | 6/2015 | Park et al. |

(Continued)

OTHER PUBLICATIONS

International Search Report dated Nov. 25, 2019 for PCT/US2019/043833.

*Primary Examiner* — Nicole M Ippolito
(74) *Attorney, Agent, or Firm* — Suiter Swantz pc llo

(57) ABSTRACT

A plasma light source with lamp house correction is disclosed. The system may include a pump source configured to generate pump illumination. The pump illumination may be directed, by an elliptical reflector element, to a volume of gas contained within a plasma lamp in order to generate a plasma. The plasma may be configured to generate broadband illumination. The system may also include a correction plate and/or an aspherical elliptical reflector element configured to alter the pump illumination to correct for aberrations introduced by the plasma lamp. The system may also include an additional aspherical correction plate configured to alter the broadband illumination to correct for aberrations introduced by optical elements of the system.

27 Claims, 19 Drawing Sheets

(56) References Cited

U.S. PATENT DOCUMENTS

| | | |
|---|---|---|
| 2015/0208494 A1 | 7/2015 | Rafac et al. |
| 2016/0005588 A1 | 1/2016 | Park et al. |
| 2017/0241914 A1* | 8/2017 | Van Heumen ....... G01N 21/956 |
| 2017/0278694 A1 | 9/2017 | Chuang et al. |

* cited by examiner

PLASMA SOURCE WITH LAMP HOUSE CORRECTION

CROSS-REFERENCE TO RELATED APPLICATION

The present application claims the benefit under 35 U.S.C. § 119(e) of U.S. Provisional Application Ser. No. 62/712,391, filed Jul. 31, 2018, entitled PLASMA SOURCE LAMP HOUSE CORRECTION METHOD, naming Shiyu Zhang, Mark Shi Wang, and Ilya Bezel as inventors, which is incorporated herein by reference in the entirety.

TECHNICAL FIELD

The present invention generally relates to plasma-based light sources, and, more particularly, to a plasma-based light source with lamp house aberration correction.

BACKGROUND

As the demand for integrated circuits having ever-smaller device features continues to increase, the need for improved illumination sources used for inspection of these ever-shrinking devices continues to grow. One such illumination source includes a laser-sustained plasma (LSP) source. Laser-sustained plasma light sources are capable of producing high-power broadband illumination. Laser-sustained plasma light sources operate by focusing laser radiation into a volume of gas contained within a plasma lamp in order to excite the gas, such as argon or xenon, into a plasma state, which is capable of emitting broadband illumination. This effect is typically referred to as "pumping" the plasma.

The effectiveness of laser-sustained light sources is based, at least in part, on the ability to generate a plasma in a tight, compact, precisely known location. However, optical components within laser-sustained plasma light sources, including plasma lamps themselves, may distort the pumping laser radiation, thereby requiring increased pumping power and leading to heat management issues. Distortions in the pumping laser radiation may distort the focus of the pump source, thereby increasing the plasma size, increasing system etendue, and decreasing throughput. Furthermore, optical components within laser-sustained plasma light sources may also cause aberrations in the illumination generated by the plasma, leading to difficulties in collecting the generated illumination and thereby decreasing throughput.

Therefore, it would be desirable to provide a system and method that cure one or more of the shortfalls identified above.

SUMMARY

A system is disclosed, in accordance with one or more embodiments of the present disclosure. In one embodiment, the system includes a pump source configured to generate pump illumination. In another embodiment, the system includes a correction plate configured to receive the pump illumination and modify one or more characteristics of the pump illumination in order to correct one or more aberrations of the pump illumination introduced by one or more optical elements of the system. In another embodiment, the system includes a reflector element configured to receive the pump illumination and direct the pump illumination to a volume of gas contained within a plasma lamp, wherein the plasma lamp is configured to sustain a plasma within the volume of gas to generate broadband illumination.

A system is disclosed, in accordance with one or more embodiments of the present disclosure. In one embodiment, the system includes a broadband illumination source. The broadband illumination source may include a pump source configured to generate pump illumination, a correction plate configured to receive the pump illumination and modify one or more characteristics of the pump illumination, and a reflector element configured to receive the pump illumination and direct the pump illumination to a volume of gas contained within a plasma lamp. In another embodiment, the plasma lamp is configured to sustain a plasma within the volume of gas to generate broadband illumination. In another embodiment, the system includes a detector assembly. In another embodiment, the system includes a set of characterization optics configured to collect at least a portion of the broadband illumination from the broadband illumination source and direct the broadband illumination onto a sample. In another embodiment, the set of characterization optics is further configured to direct radiation from the sample to the detector assembly.

A system is disclosed, in accordance with one or more embodiments of the present disclosure. In one embodiment, the system includes a pump source configured to generate pump illumination. In another embodiment, the system includes a first correction plate configured to receive the pump illumination and modify one or more characteristics of the pump illumination. In another embodiment, the system includes a reflector element configured to receive the pump illumination and direct the pump illumination to a volume of gas contained within a plasma lamp. In another embodiment, the plasma lamp is configured to sustain a plasma within the volume of gas to generate broadband illumination. In another embodiment, the system includes a second correction plate configured to receive the broadband illumination and correct one or more aberrations of the broadband illumination, wherein the second correction plate comprises an aspherical correction plate.

A system is disclosed, in accordance with one or more embodiments of the present disclosure. In one embodiment, the system includes a broadband illumination source. In another embodiment, the broadband illumination source includes a pump source configured to generate pump illumination, a first correction plate configured to receive the pump illumination and modify one or more characteristics of the pump illumination, and a reflector element configured to receive the pump illumination and direct the pump illumination to a volume of gas contained within a plasma lamp. In another embodiment, the plasma lamp is configured to sustain a plasma within the volume of gas to generate broadband illumination. In another embodiment, the broadband illumination source includes a second correction plate configured to receive the broadband illumination and correct one or more aberration of the broadband illumination. In another embodiment, the second correction plate comprises an aspherical correction plate. In another embodiment, the system includes a detector assembly. In another embodiment, the system includes a set of characterization optics configured to collect at least a portion of the broadband illumination from the broadband illumination source and direct the broadband illumination onto a sample, wherein the set of characterization optics is further configured to direct radiation from the sample to the detector assembly.

A method is disclosed, in accordance with one or more embodiments of the present disclosure. In one embodiment, the method includes generating pump illumination. In another embodiment, the method includes correcting the pump illumination with a first correction plate. In another embodiment, the method includes collecting and focusing the pump illumination to a volume of gas contained within a plasma lamp with a reflector element. In another embodiment, the method includes generating a plasma within the volume of gas contained within the plasma lamp. In another embodiment, the method includes generating broadband illumination with the plasma. In another embodiment, the method includes correcting one or more aberrations of the broadband illumination with a second correction plate.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1A:
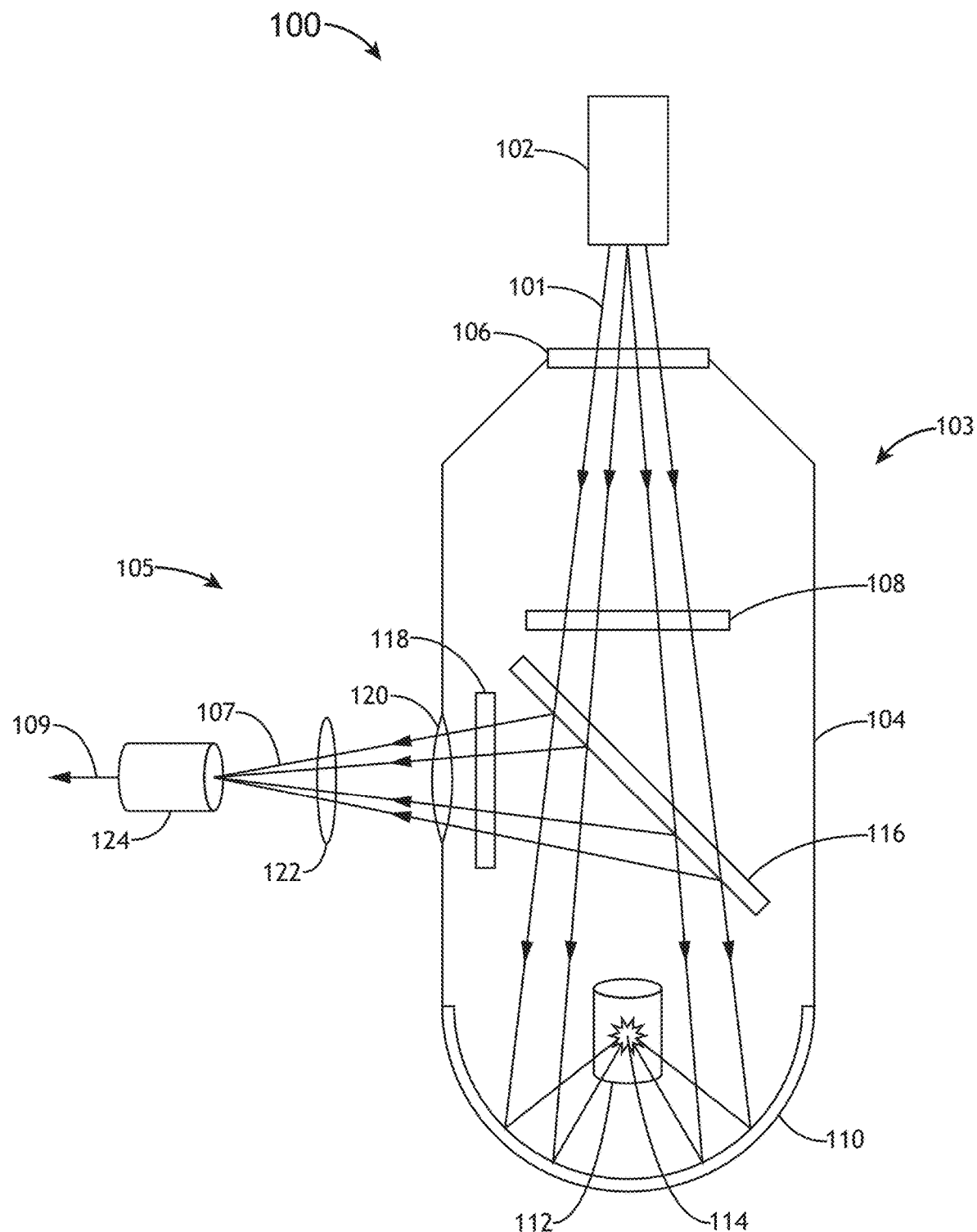
FIG. 1A illustrates a plasma source with lamp house correction system, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Referring generally to FIGS. 1A-13, a plasma source with lamp house correction system and method are described, in accordance with one or more embodiments of the present disclosure.

Embodiments of the present disclosure are directed to a system and method for correcting errors attributable to components in laser-sustained plasma (LSP) light sources. More particularly, embodiments of the present disclosure are directed to systems and methods for correcting aberrations attributable to components in LSP light sources including, but not limited to, compensators, plasma lamps, and the like. Additional embodiments of the present disclosure are directed to the use of aspherical correction plates and/or aspherical reflector elements to modify pump illumination of a LSP light source in order to correct for aberrations attributable to components of the LSP light source. Additional embodiments of the present disclosure are directed to the use of aspherical correction plates to modify broadband illumination generated by plasma of an LSP light source in order to correct for aberrations attributable to components of the LSP light source.

As noted previously herein, optical components of LSP light sources may distort the pumping radiation/illumination of an LSP light source. Distortions in the pump radiation/illumination may require additional pumping power to achieve the same throughput, therefore leading to heat management issues. Additionally, distorted pump radiation may distort the focus of the pump radiation, thereby increasing the size of the plasma, increasing the system etendue, and decreasing system throughput. Furthermore, optical components within LSP light sources may also cause aberrations in the broadband illumination generated by the plasma itself, leading to difficulties in collecting the generated illumination and thereby decreasing throughput.

For example, LSP light sources may utilize plasma lamps of different shapes including, but not limited to, cylindrical plasma lamps, prolate spheroid-shaped plasma lamps (e.g., "football-shaped" plasma lamps), and the like. These plasma lamp configurations may distort illumination entering and leaving the plasma lamps. If left uncorrected, these distortions and/or aberrations caused by the plasma lamps and other optical elements may increase the power required for the LSP light source, decrease the effectiveness of the LSP light source, and decrease throughput. Accordingly, embodiments of the present disclosure are directed toward systems and methods for correcting aberrations resulting from optical components of LSP light sources. Correction of aberrations within an LSP light source may reduce the required pumping power, generate a tighter, brighter plasma focus, and improve the collection of illumination generated by the plasma.

Figure 1B:
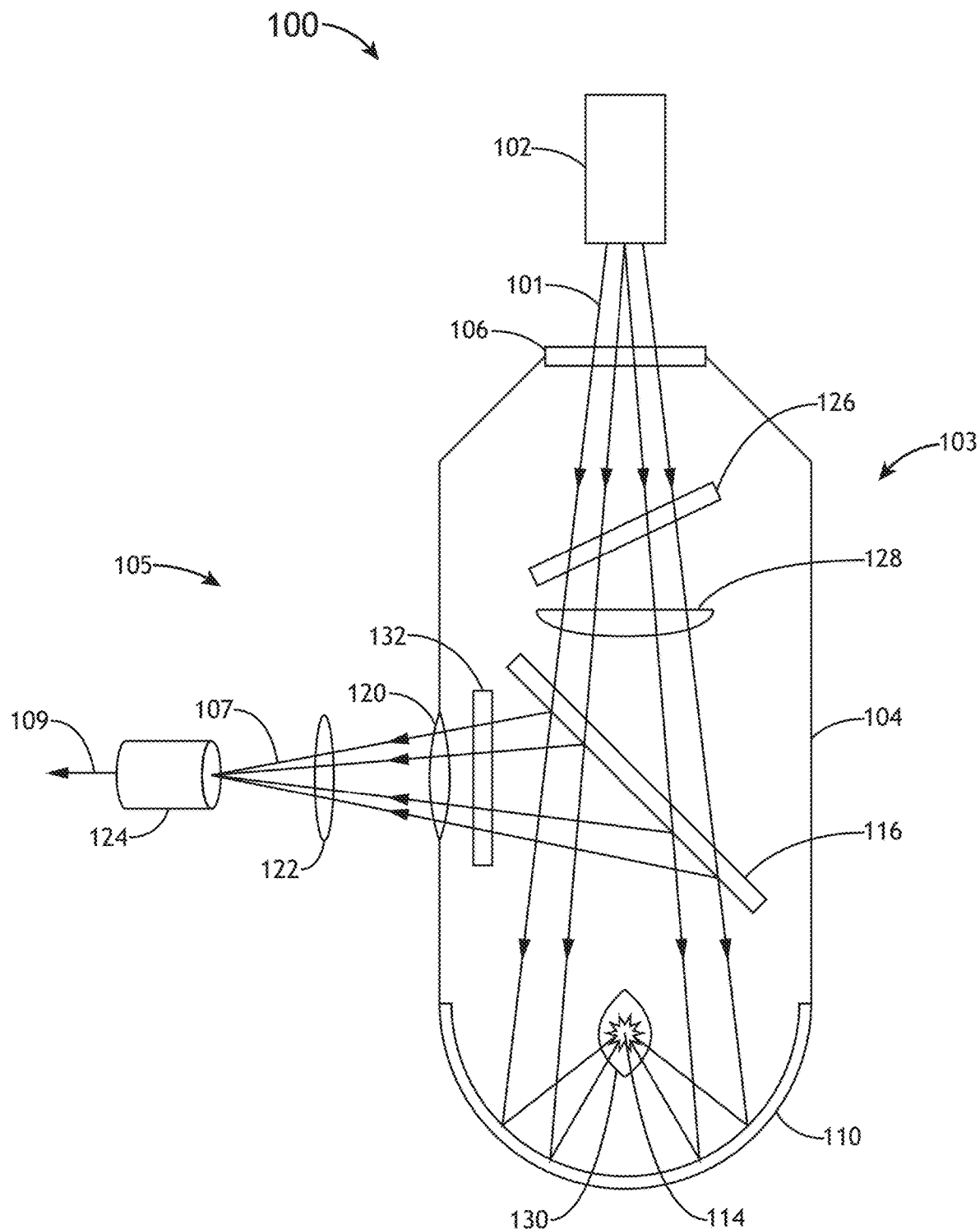
FIG. 1B illustrates a plasma source with lamp house correction system, in accordance with one or more embodiments of the present disclosure.

FIGS. 1A and 1B illustrate a plasma source with lamp house correction system 100, in accordance with one or more embodiments of the present disclosure. Generally, system 100 may include a pump source 102, a lamp house 104, an entry window 106, a cold mirror 116, a reflector element 110, and an exit window 120.

FIG. 1A illustrates a plasma source with lamp house correction system 100, in accordance with one or more embodiments of the present disclosure. System 100 may include, but is not limited to, a pump source 102 and a lamp house 104. The lamp house 104 may include, but is not limited to, an entry window 106, a correction plate 108, a reflector element 110, a plasma lamp 112 configured to contain a volume of gas and generate a plasma 114, a cold mirror 116, an additional correction plate 118, and an exit window 120. In another embodiment, system 100 may include one or more optical elements 122 and one or more downstream optical elements 124. It is noted herein that the configuration depicted is not to be regarded as limiting, unless noted otherwise herein. In this regard, system 100 may include additional/fewer optical elements than those shown and described. By way of example, the additional correction plate 118 and the exit window 120 may be combined into a single component, such that the additional correction plate 118 acts as an exit window.

In one embodiment, pump source 102 is configured to generate pump illumination 101 and direct the pump illumination 101 along a pumping path 103. Pump source 102 may include any illumination source configured to pump plasma known in the art including, but not limited to, one or more lasers. For example, pump source 102 may include one or more fiber lasers or any forms of power energy known in the art. For instance, pump source 102 may include one or more 200 μm fiber lasers. By way of another example, pump source 102 may include one or more infrared lasers. It is noted herein that, for the purposes of the present disclosure, the terms "pump illumination 101" and "pump radiation 101" may be used interchangeably, unless noted otherwise herein. Furthermore, the term "pumping path 103," and like terms, may refer to the path pump illumination 101 takes from the pump source 102 to the plasma 114. Pump illumination 101 may include illumination/radiation of any wavelength or wavelength range known in the art including, but not limited to, infrared (IR) radiation, near infrared (NIR) radiation, ultraviolet (UV) radiation, visible radiation, and the like.

In another embodiment, pump illumination 101 enters the lamp house 104 via an entry window 106. Entry window 106 may include any optical element known in the art for transmitting illumination including, but not limited to, one or more windows, one or more lenses, one or more ports, and the like. In another embodiment, pump illumination 101 is directed to a correction plate 108. Correction plate 108 may include a cylindrical correction plate. In one embodiment, correction plate 108 is configured to alter one or more characteristics of pump illumination 101. For example, correction plate 108 may be configured to correct one or more aberrations of the pump illumination introduced by optical elements of system 100.

In another embodiment, pump illumination 101 is directed to a reflector element 110. As shown in FIG. 1A, reflector element 110 may include an elliptical reflector element 110. However, this is not to be regarded as a limitation unless noted herein, as elliptical reflector 110 element may take any shape known in the art for directing the pump illumination 101 to the plasma lamp 112. The reflector element 110 may be configured to receive pump illumination 101 and direct the pump illumination 101 to a volume of gas contained within the plasma lamp 112 in order to generate a plasma 114 within the volume of gas. The plasma lamp 112 may take any shape known in the art for containing a volume of gas. For example, as shown in FIG. 1A, the plasma lamp 112 may include a cylindrical plasma lamp 112. Cylindrical plasma lamp 112 may contain a volume of gas including any gas or mixture of gasses known in the art suitable for generating a plasma including, but not limited to, xenon (Xe), argon (Ar), and the like. In one embodiment, the volume of gas contained within the cylindrical plasma lamp 112 may be contained at a high pressure. For example, the volume of gas within cylindrical plasma lamp 112 may be at 10 atm.

As noted previously herein, the plasma lamp 112 may distort pump illumination 101 entering the plasma lamp 112 and/or distort broadband illumination 107 (e.g., broadband radiation 107) generated by the plasma 114 and exiting the plasma lamp 112. Furthermore, additional optical elements of system 100 may introduce additional distortions. These distortions may result in one or more aberrations in the broadband illumination 107 generated by the plasma, thereby reducing the effectiveness of system 100 and reducing throughput. Aberrations introduced by the plasma lamp 112 and/or additional optical elements of system 100 may be better understood with reference to FIGS. 2A and 2B.

Figure 2A:
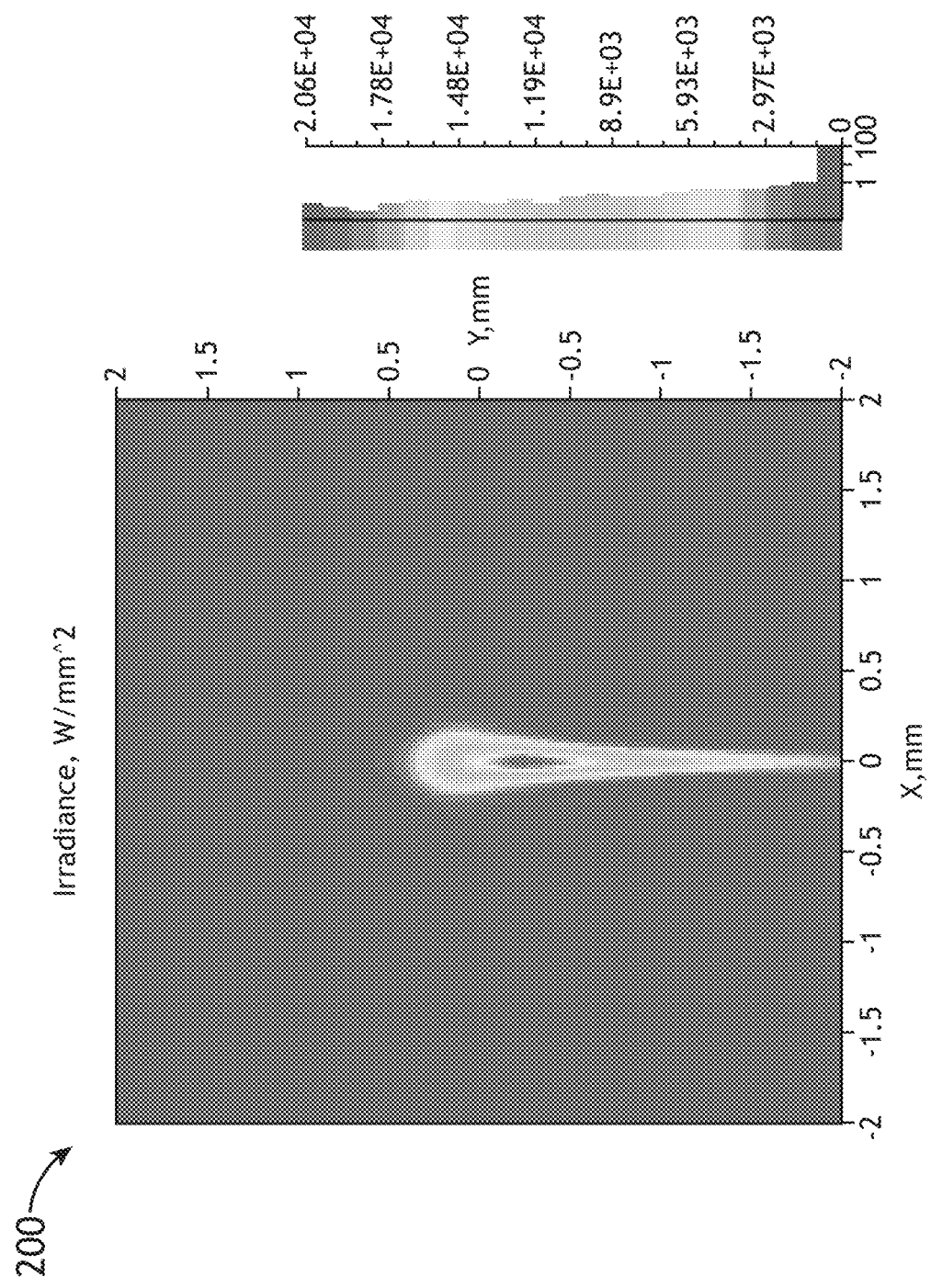
FIGS. 2A and 2B illustrate pumping focus profile cross sections near the elliptical reflector in a system with a cylindrical plasma lamp, in accordance with one or more embodiments of the present disclosure.
Figure 2B:
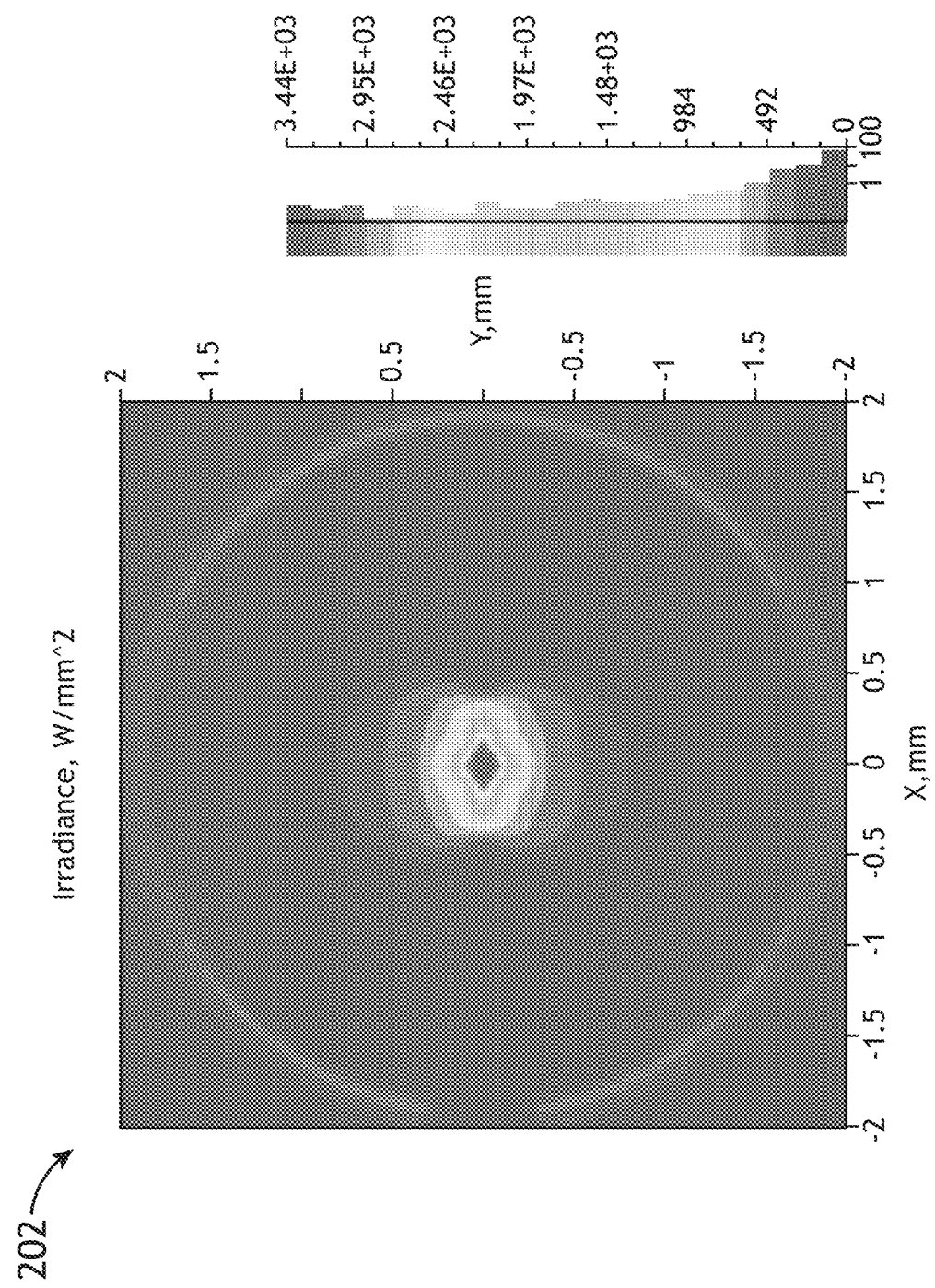

FIGS. 2A and 2B illustrate pumping focus profile cross sections near the elliptical reflector in a system 100 with a cylindrical plasma lamp 112, in accordance with one or more embodiments of the present disclosure. The irradiance of the focus profile in graphs 200 and 202 is expressed in units of W/mm$^2$. Graph 200, as depicted in FIG. 2A, illustrates the pumping focus profile cross section along the X-Y plane. Graph 202, as depicted in FIG. 2B, illustrates the pumping focus profile cross section along the X-Z plane. As can be seen in FIGS. 2A and 2B, cylindrical plasma lamps (e.g., cylindrical plasma lamp 112) may introduce large amounts of distortion/aberration near the reflector element 110 (e.g., elliptical reflector element 110). By way of example, a 28 μm plasma ball at the ellipse focus may be reimaged to more than 60 mm at the pumping focus. If uncorrected, this level of distortion/aberration may result in decreased pumping efficiency, decreased broadband illumination 107 collection efficiency, and decreased throughput.

With reference again being made to FIG. 1A, reflector element 110 (e.g., elliptical reflector element 110) may be configured to correct for one or more aberrations induced by the plasma lamp 112 and/or additional optical elements along the pumping path 103. In one embodiment, the reflector element 110 may include an odd-term aspherical reflector element to minimize and/or reduce aberrations introduced by the plasma lamp 112 and/or additional optical elements. In one embodiment, a number of odd aspherical terms may be added to the reflector element 110 (e.g., elliptical reflector element 110) in order to correct for aberrations introduced by the plasma lamp 112 (e.g., cylindrical plasma lamp 112). For example, two orders of odd aspherical terms may be added to the reflector element 110. By way of another example, six orders of odd aspherical terms may be added to the reflector element 110. By further way of example, one hundred orders of odd aspherical terms may be added to the reflector element.

The surface profile of an aspherical reflector element 110 (e.g., aspherical elliptical reflector element 110) may be described by Equation 1:

$$z = \frac{cr^2}{1+\sqrt{1-(1+k)c^2r^2}} + \sum_{i=1}^{n} a_i r^i \qquad \text{(Equation 1)}$$

where k is the conic constant of the reflector element 110, c is the base radius of curvature, r is the radius of the reflector element 110, and $\alpha_i$ is the coefficient for $r^i$, where i may be 1, 2, 3 . . . n. In some embodiments, Equation 1 may be simplified and expressed as Equation 2:

$$z = \Sigma_{i=1}^{n} \alpha_i r^i \qquad \text{(Equation 2)}$$

Figure 3B:
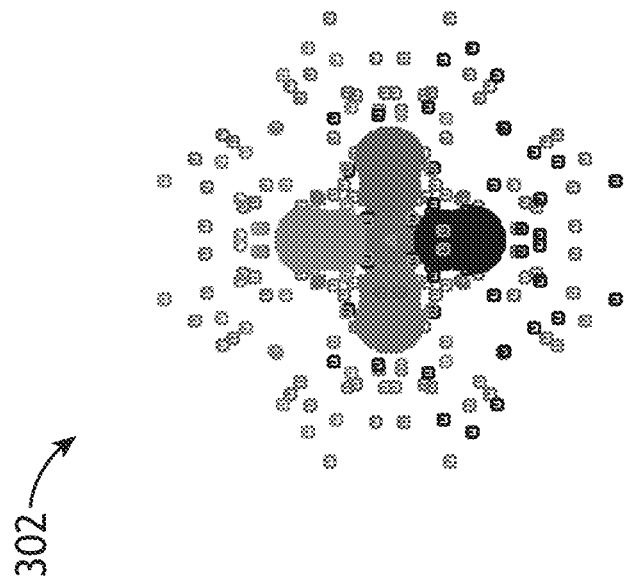
FIGS. 3A and 3B illustrate pumping thermal profile cross sections at the elliptical reflector focus in a system with a cylindrical plasma lamp, in accordance with one or more embodiments of the present disclosure.
Figure 3A:
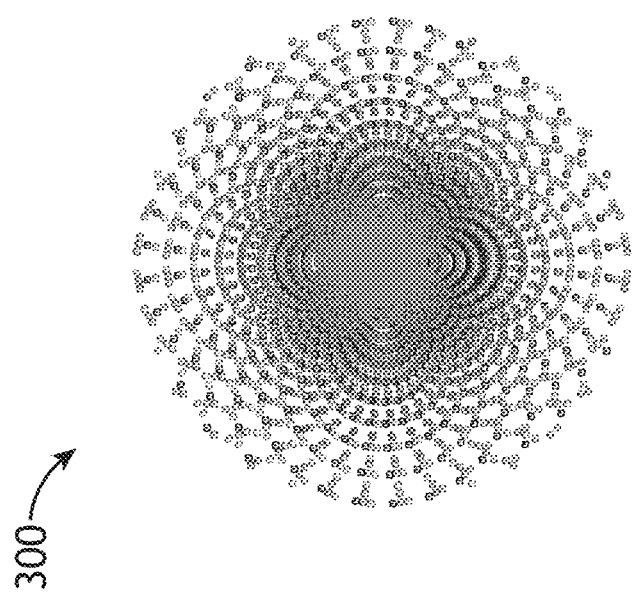

The benefits which may be achieved using an aspherical reflector element 110 to correct for aberrations introduced along the pumping path 103 may be better understood with reference to FIGS. 3A and 3B.

FIGS. 3A and 3B illustrate pumping thermal profile cross sections at the elliptical reflector focus in a system 100 with a cylindrical plasma lamp 112, in accordance with one or more embodiments of the present disclosure. Graphs 300, 302 illustrate the pumping thermal profile cross section of a 28 μm plasma ball at the elliptical reflector focus. Graph 300 (FIG. 3A) illustrates the thermal profile cross section of a system without an aspherical reflector element 110, and graph 302 (FIG. 3B) illustrates the thermal profile cross section of a system with an aspherical reflector element 110 to correct for aberrations along the pumping path 103. Comparing FIGS. 3A and 3B, it may be seen that an aspherical reflector element 110 may be able to correct aberrations introduced by a cylindrical plasma lamp 112 and/or other optical elements along the pumping path 103. In some embodiments, the inclusion of an aspherical reflector element 110 may reduce the pumping thermal profile cross section by over sixty times.

As noted previously, the reflector element 110 may direct and focus pump illumination 101 into the volume of gas contained within plasma lamp 112 in order to generate a plasma 114. In another embodiment, plasma 114 emits broadband illumination 107. Broadband illumination 107 may include illumination/radiation of various wavelengths including, but not limited to, ultraviolet (UV) radiation, deep ultraviolet (DUV) radiation, vacuum ultraviolet (VUV) radiation, and the like. Broadband illumination 107 may be directed by cold mirror 116. Cold mirror 116 may include any optical element known in the art including, but not limited to, a beam splitter, a sampler, a filter, and the like. In another embodiment, cold mirror 116 directs the broadband illumination 107 along a collection path 105 to an additional correction plate 118. It is noted herein that collection path 105 may be regarded as the path of broadband illumination 107 from the plasma 114 to the downstream optical elements 124.

In another embodiment, cold mirror 116 directs broadband illumination 107 to an additional correction plate 118. In additional and/or alternative embodiments, the additional correction plate 118 may be configured to correct any distortions and/or aberrations introduced in the broadband illumination 107 along the collection path 105. In this regard, additional correction plate 118 may include an aspherical correction plate 118. For example, additional correction plate 118 may include an odd-term aspherical correction plate 118. It is noted herein that the use of an additional correction plate 118 in the collection path 105 may improve the correction of broadband illumination 107, and therefore increase throughput and efficiency of system 100.

Figure 4B:
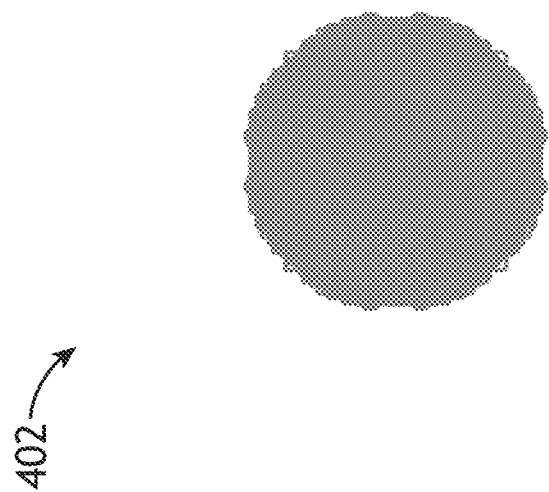
FIGS. 4A and 4B illustrate collection thermal profile cross sections at the elliptical reflector focus in a system with a cylindrical plasma lamp, in accordance with one or more embodiments of the present disclosure.
Figure 4A:
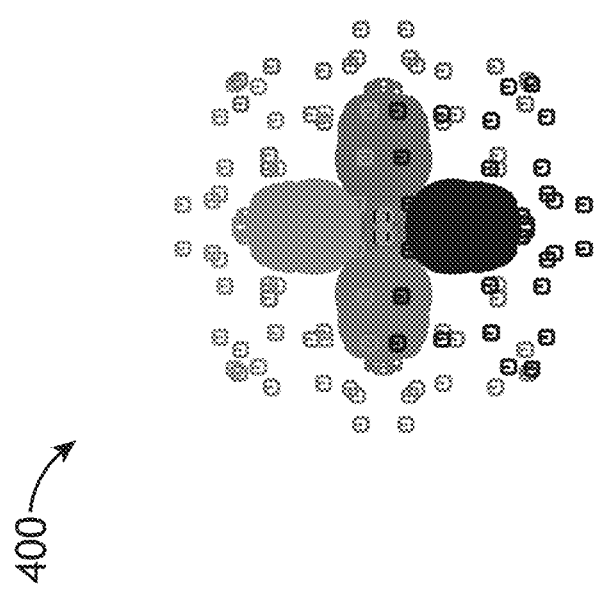

The benefits of an additional correction plate 118 to correct distortions and/or aberrations introduced along the collection path 105 may be better understood with reference to FIGS. 4A and 4B.

FIGS. 4A and 4B illustrate thermal profile cross sections at the elliptical reflector focus in a system 100 with a cylindrical plasma lamp 112, in accordance with one or more embodiments of the present disclosure. Graph 400 of FIG. 4A illustrates a thermal profile cross section for a 28 μm plasma disk located at the elliptical focus. Similarly, graph 402 of FIG. 4B illustrates a thermal profile cross section for a 28 μm plasma ball located at the elliptical focus.

Reference will again be made to FIG. 1A. In another embodiment, broadband illumination 107 is directed along the collection path 105 to an exit window 120. Exit window 120 may include any optical element configured to allow broadband illumination 107 exit the lamp house 104 including, but not limited to, one or more windows, one or more lenses, one or more ports, and the like. In another embodiment, broadband illumination 107 is directed through one or more optical elements 122 along the collection path 105. The one or more optical elements 122 may include any optical elements known in the art including, but not limited to, one or more color filters, one or more lenses, one or more mirrors, one or more beam splitters, one or more prisms, and the like. In another embodiment, the one or more optical elements 122 direct the broadband illumination 107 to a one or more downstream optical elements 124. The one or more downstream optical elements 124 may include any optical elements known in the art for forming, collecting, or focusing characterization illumination 109 including, but not limited to, one or more homogenizers, one or more polarizers, one or more beam-shapers, and the like. Characterization illumination 109 may be used for any downstream characterization systems including, but not limited to, imaging systems, metrology systems, spectroscopy systems, and the like.

It is noted herein that the orders of optical elements arranged along the pumping path 103 and/or the collection path 105 are not to be regarded as limiting, unless noted otherwise herein. For example, after being directed by the cold mirror 116, broadband illumination 107 may exit the lamp house 104 via exit window 120 before interacting with the additional correction plate 118. Accordingly, the order of optical elements in FIG. 1A is provided solely for illustration, unless noted otherwise herein.

FIG. 1B illustrates a plasma source lamp house correction system 100, in accordance with one or more embodiments of the present disclosure. System 100 may include, but is not limited to, a pump source 102 and a lamp house 104. The lamp house 104 may include, but is not limited to, an entry window 106, a compensator plate 126, a correction plate 128, a reflector element 110, a plasma lamp 130 (e.g., prolate spheroid-shaped plasma lamp 130), a cold mirror 116, an additional correction plate 132, and an exit window 120. It is noted herein that, to the extent that it is applicable, any description associated with FIG. 1A may be regarded as applying to FIG. 1B, unless noted otherwise herein. Similarly, to the extent that it is applicable, any description associated with FIG. 1B may be regarded as applying to FIG. 1A, unless noted otherwise herein.

In one embodiment, as depicted in FIG. 1B, the plasma lamp includes a substantially prolate spheroid-shaped plasma lamp 130 (e.g., substantially "football-shaped" plasma lamp 130). Similar to that of the cylindrical plasma lamp 112, it is noted herein that the prolate spheroid-shaped plasma lamp 130 may introduce aberrations into system 100. In systems where aberrations introduced by a prolate spheroid plasma lamp 130 are not corrected, pumping laser power may range from around 4 to 7 kilowatts (kW). Aberrations introduced by a prolate spheroid-shaped plasma lamp 130 may be better understood with reference to FIG. 5A.

Figure 5A:
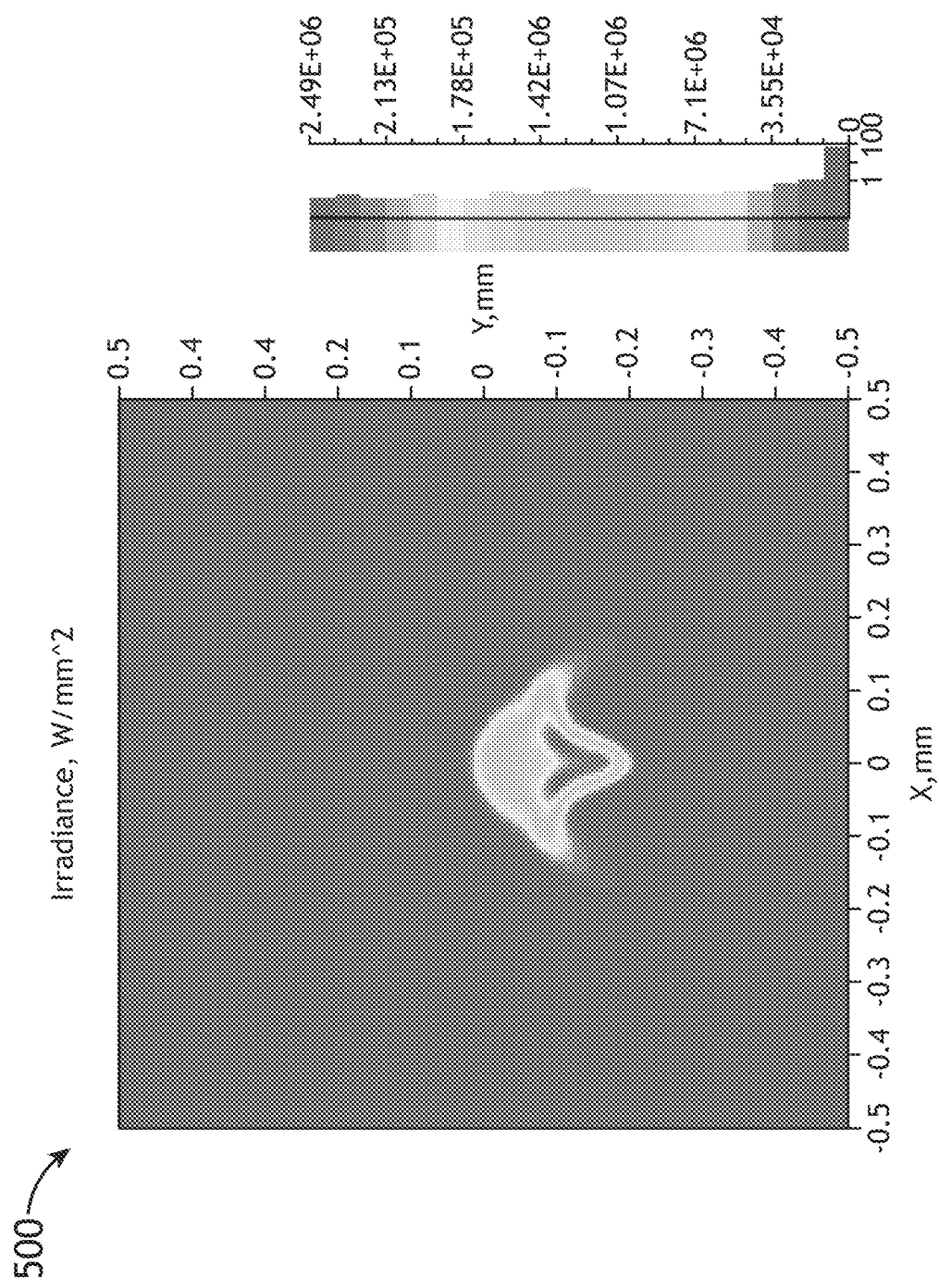
FIGS. 5A and 5B illustrate pumping focus profile cross sections at the elliptical reflector focus in a system with a prolate spheroid-shaped plasma lamp, in accordance with one or more embodiments of the present disclosure.

FIG. 5A illustrates a pumping focus profile cross section at the elliptical reflector focus in a system 100 with a prolate spheroid-shaped plasma lamp 130, in accordance with one or more embodiments of the present disclosure. Graph 500, depicted in FIG. 5A, illustrates the pumping focus profile cross section for a 200 μm fiber laser source. As can be seen in FIG. 5A, a prolate spheroid-shaped plasma lamp 130 may introduce significant distortions and/or aberrations into system 100 which need to be corrected.

Reference will again be made to FIG. 1B. In one embodiment, system 100 includes a compensator plate 126. It is noted herein that, in addition to plasma lamps (e.g., cylindrical plasma lamp 112, prolate spheroid-shaped plasma lamp 130, and the like), compensator plate 126 may introduce distortions and/or aberrations into system 100 which need to be corrected.

In another embodiment, system 100 includes correction plate 128. It is noted herein that the discussion regarding correction plate 108 and additional correction plate 118 may be regarded as applying to correction plate 128, unless noted otherwise herein. In one embodiment, correction plate 128 includes an aspherical correction plate 128. Correction plate 128 (e.g., aspherical correction plate 128) may be configured to correct one or more aberrations and/or astigmatisms introduced by the compensator plate 126, cold mirror 116, plasma lamp (e.g., prolate spheroid-shaped plasma lamp 130), and the like. In one embodiment, correction plate 128 may comprise a modified cylindrical correction plate. For example, correction plate 128 may be formed by adding up to three orders of odd aspherical terms on the back surface of cylindrical correction plate 108. In another embodiment, correction plate 128 may comprise two separate correction plates: an odd aspheric corrector and a cylindrical corrector which may be configured to correct one or more aberrations and/or astigmatisms introduced by the compensator plate 126, cold mirror 116, plasma lamp (e.g., prolate spheroid-shaped plasma lamp 130), and the like. In yet another embodiment, correction plate 128 may include an anamorphic profile which combines odd aspheric terms with cylindrical correction terms onto a single surface of correction plate 128.

Figure 6:
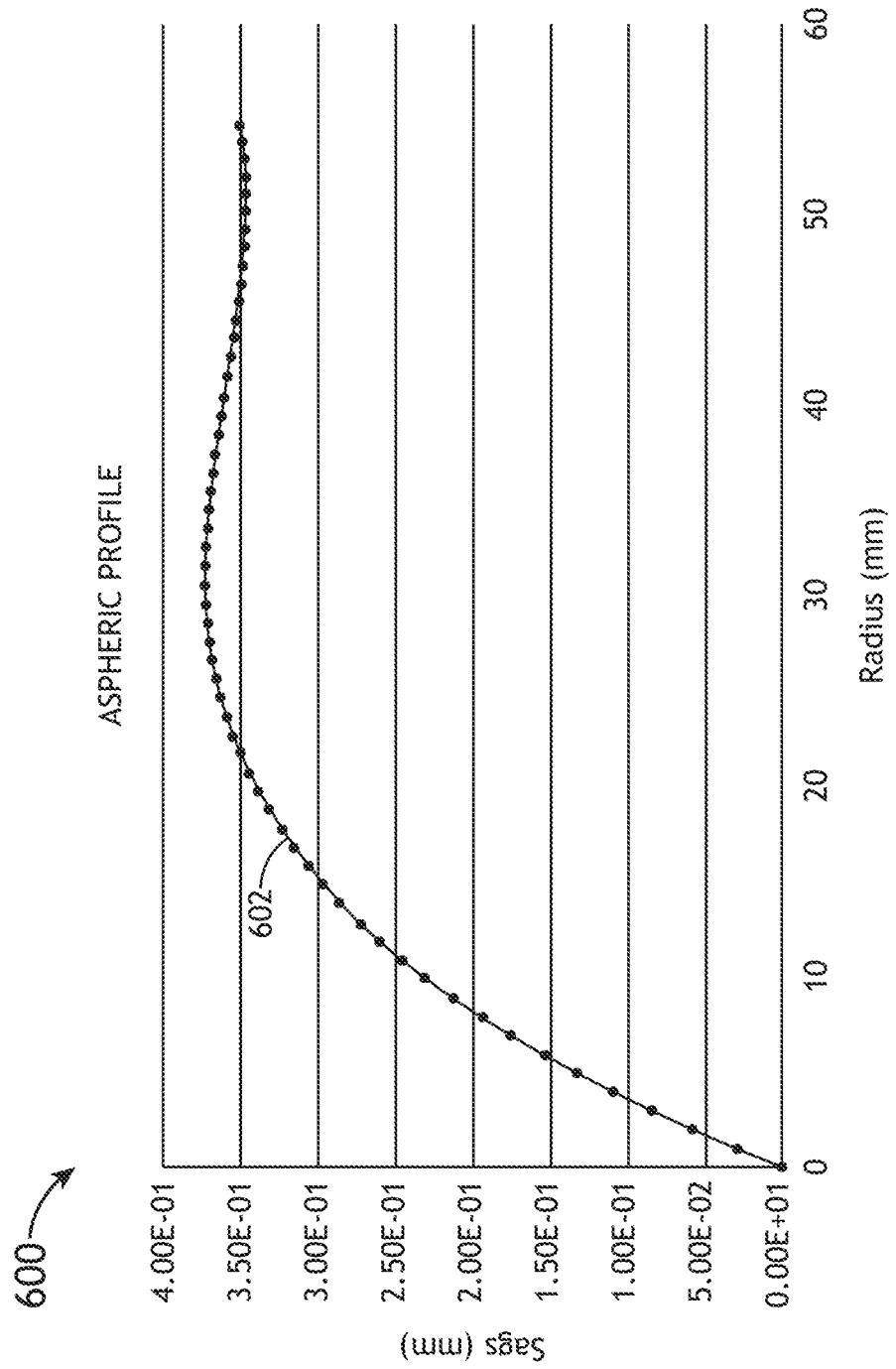
FIG. 6 illustrates a surface profile graph of an aspherical correction plate, in accordance with one or more embodiments of the present disclosure.

The aspherical profile of correction plate 128 (e.g., aspherical correction plate 128) may be better understood with reference to FIG. 6.

FIG. 6 illustrates a surface profile graph 600 of an aspherical correction plate (e.g., aspherical correction plate 128), in accordance with one or more embodiments of the present disclosure. In one example, curve 602 of graph 600 may illustrate the surface profile of correction plate 128 (e.g., aspherical correction plate 128). It is noted herein, however, that curve 602 is provided solely for illustration, and is not to be regarded as a limitation on the scope of the present disclosure, unless noted otherwise herein.

Correction plate 128 may help correct aberrations and/or astigmatisms introduced into system 100 along the pumping path 103. To further illustrate this effect, reference will again be made to FIGS. 5A and 5B.

Figure 5B:
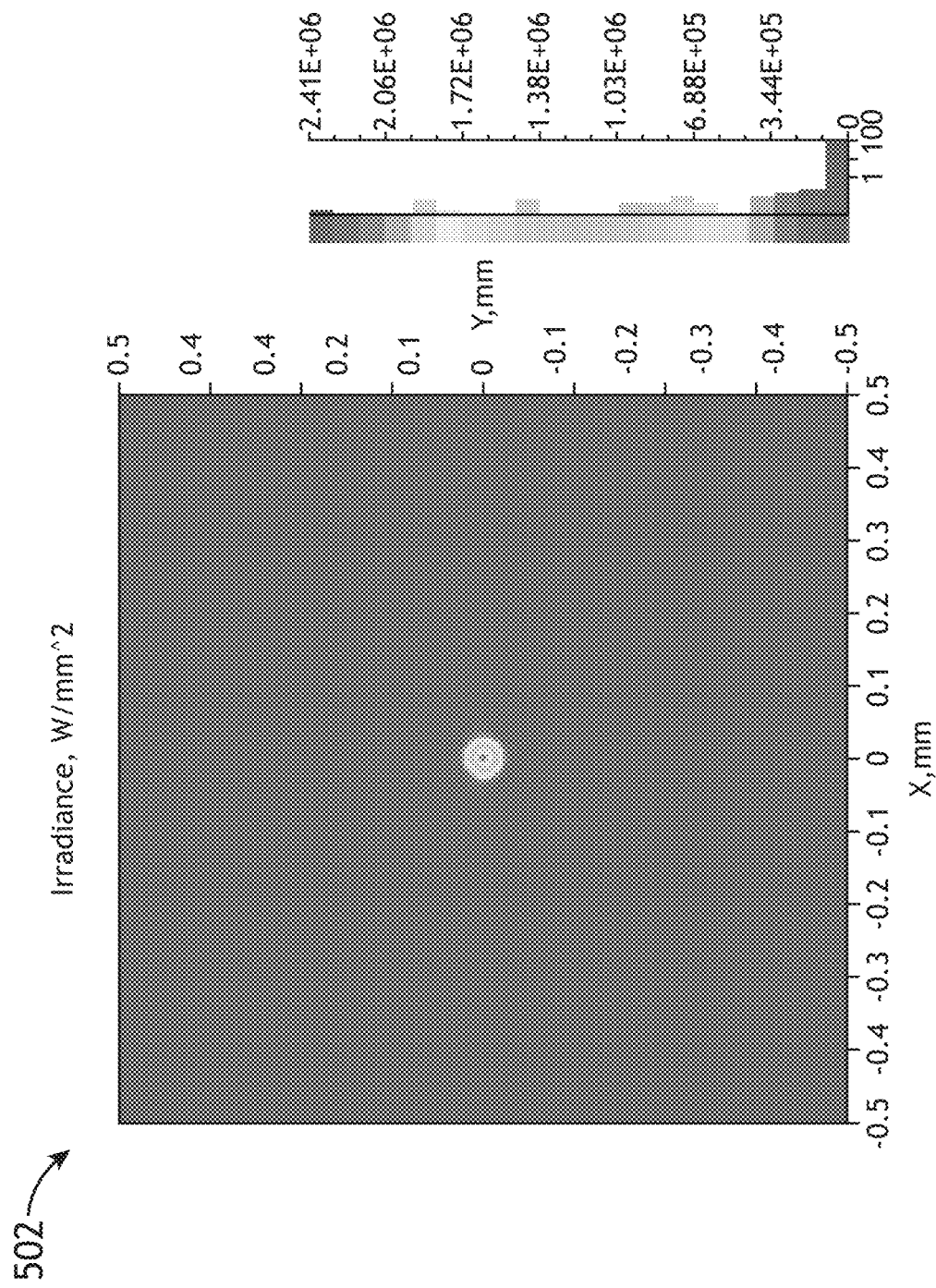

FIGS. 5A and 5B illustrate pumping focus profile cross sections at the elliptical reflector focus in a system 100 with a prolate spheroid-shaped plasma lamp 130, in accordance with one or more embodiments of the present disclosure. More particularly, graph 500, depicted in FIG. 5A, illustrates the pumping focus profile cross section for a 200 μm fiber laser source, uncorrected by correction plate 128. Conversely, graph 502, depicted in FIG. 5B, illustrates the pumping focus profile cross section for the 200 μm fiber laser source corrected by correction plate 128.

As can be seen in graph 502, for a corrected 200 μm fiber laser source, the full width at half maximum (FWHM) of the focus profile cross section is around 20 μm. Additionally, a 200 μm fiber laser source may be capable of providing around 4 kW of power, and may thus be sufficient for use in a wide range of LSP light sources, even when corrected with a correction plate 128. Comparing graphs 500 and 502, it may be appreciated that the corrected focus energy density (e.g., corrected with system 100), may be between ten and fifty-five times that of the uncorrected focus energy density. The level of improvement achieved by system 100 may be dependent on a number of factors including, but not limited to, the type of pump source 102, the manufacturing of the plasma lamp (e.g., cylindrical plasma lamp 112, prolate spheroid-shaped plasma lamp 130, and the like), alignment tolerance, and the like.

Figure 7A:
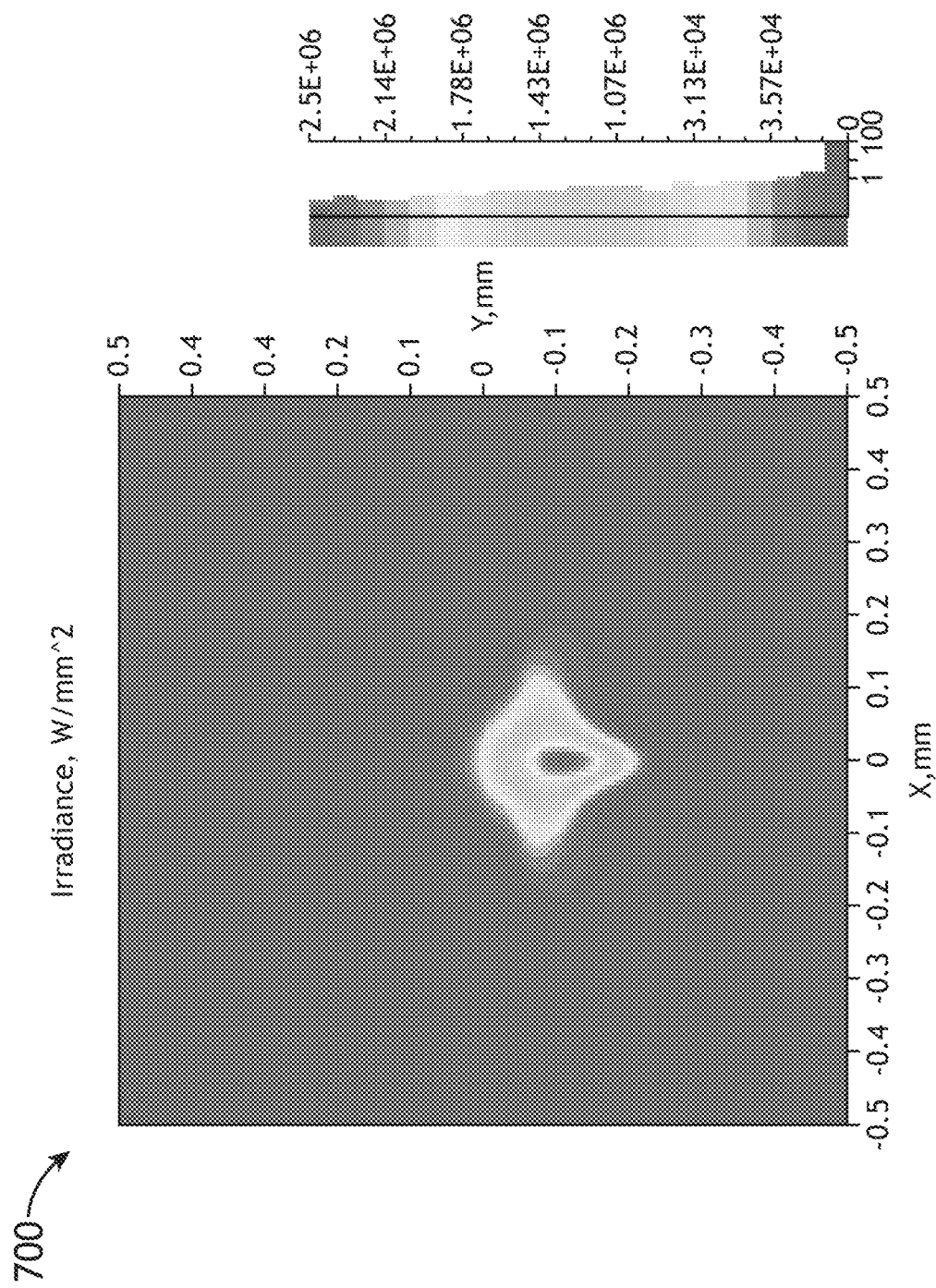
FIGS. 7A and 7B illustrate pumping focus profile cross sections at the elliptical reflector focus in a system with a prolate spheroid-shaped plasma lamp, in accordance with one or more embodiments of the present disclosure.
Figure 7B:
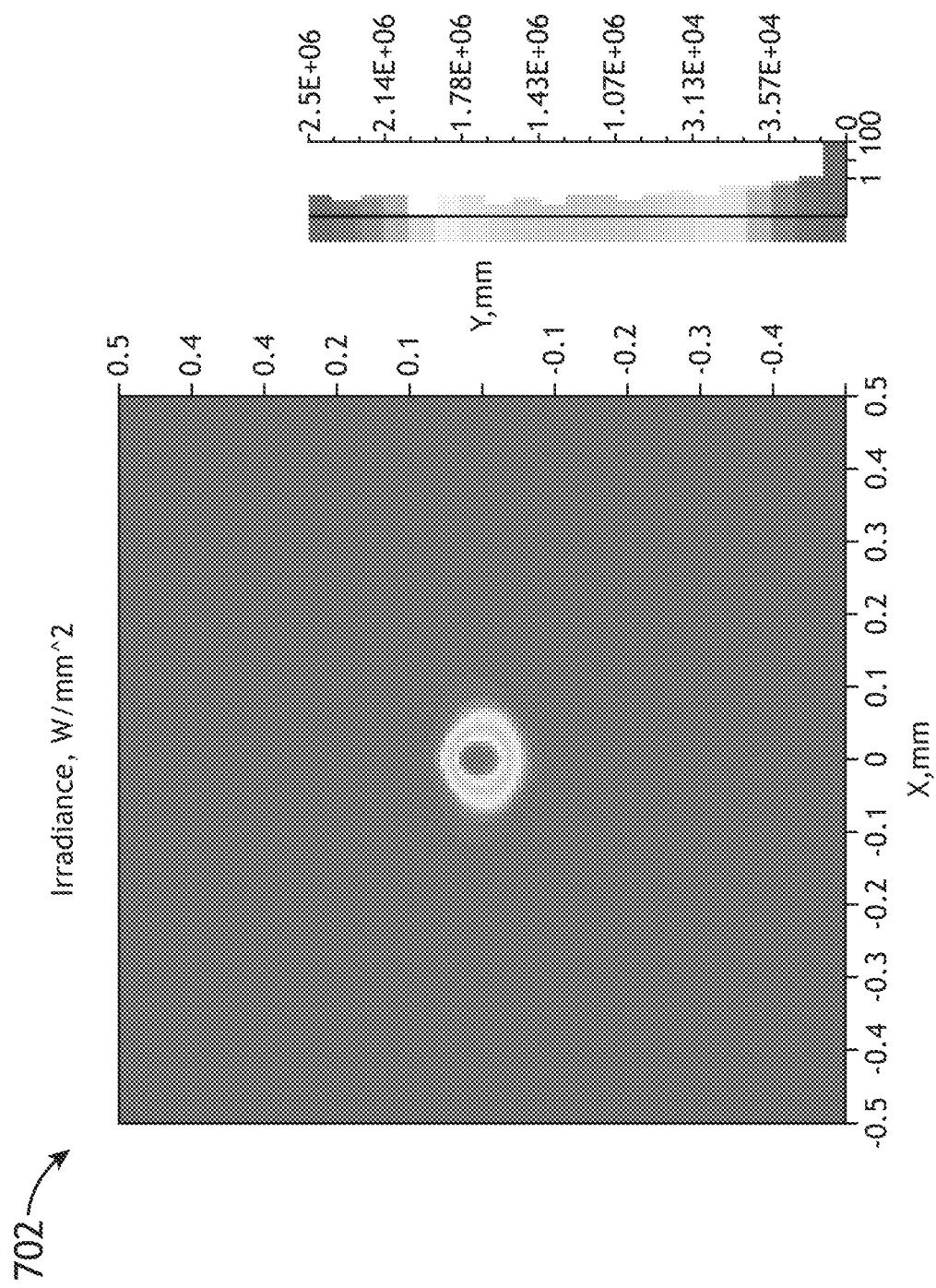

FIGS. 7A and 7B illustrate pumping focus profile cross sections at the elliptical reflector focus in a system 100 with a prolate spheroid-shaped plasma lamp 130, in accordance with one or more embodiments of the present disclosure. More particularly, graph 700, depicted in FIG. 6A, illustrates the pumping focus profile cross section for a 600 μm fiber laser source, uncorrected by correction plate 128. Conversely, graph 702, depicted in FIG. 6B, illustrates the pumping focus profile cross section for the 600 μm fiber laser source corrected by correction plate 128. Comparing graphs 700 and 702, the corrected focus energy density (e.g., corrected with system 100), is around 2.4 times that of the uncorrected focus energy density, indicating an improvement of around 140% for the 600 μm fiber laser source.

It is noted herein that the location of the pump source 102 may be adjusted in order to alter the location of the pump illumination 101 focus. For example, the tip of a fiber laser may be adjusted along an optical axis in order to change the location of the plasma 114. For instance, moving the tip of a fiber laser approximately 6.4 mm may result in moving the plasma 114 approximately 5.5 μm.

Reference will again be made to FIG. 1B. Following the correction plate 128, pump illumination 101 may be directed along the pumping path 103 to reflector element 110 (e.g., elliptical reflector element 110). The reflector element 110 may be configured to receive pump illumination 101 and direct the pump illumination 101 to a volume of gas contained within prolate spheroid-shaped plasma lamp 130 in order to generate a plasma 114 within the volume of gas. In another embodiment, plasma 114 generates broadband illumination 107 including, but not limited to, ultraviolet (UV) illumination, deep ultraviolet (DUV) illumination, vacuum ultraviolet (VUV) illumination, and the like.

In another embodiment, cold mirror 116 may direct the broadband illumination 107 along a collection path 105 to an additional correction plate 132. In additional and/or alternative embodiments, the additional correction plate 132 may be configured to correct any distortions and/or aberrations introduced in the broadband illumination 107 by optical elements along the collection path 105 including, but not limited to, the prolate spheroid-shaped plasma lamp 130. In this regard, additional correction plate 132 may include an aspherical correction plate 132. For example, additional correction plate 132 may include an odd-term aspherical correction plate 132. It is noted herein that the use of an additional correction plate 132 in the collection path 105 may improve the correction of broadband illumination 107, and therefore increase throughput and efficiency of system 100.

It is further noted herein that the discussion associated with correction plate 108, additional correction plate 118, and correction plate 128 may be regarded as applying to additional correction plate 132, unless noted otherwise herein. Accordingly, in one embodiment, up to three orders of odd aspherical terms may be added to additional correction plate 132 in order to correct for aberration introduced by the prolate spheroid-shaped plasma lamp 130. Additionally, it is noted herein that the surface profile of additional correction plate 132 may be described by Equation 1 or Equation 2.

Figure 8:
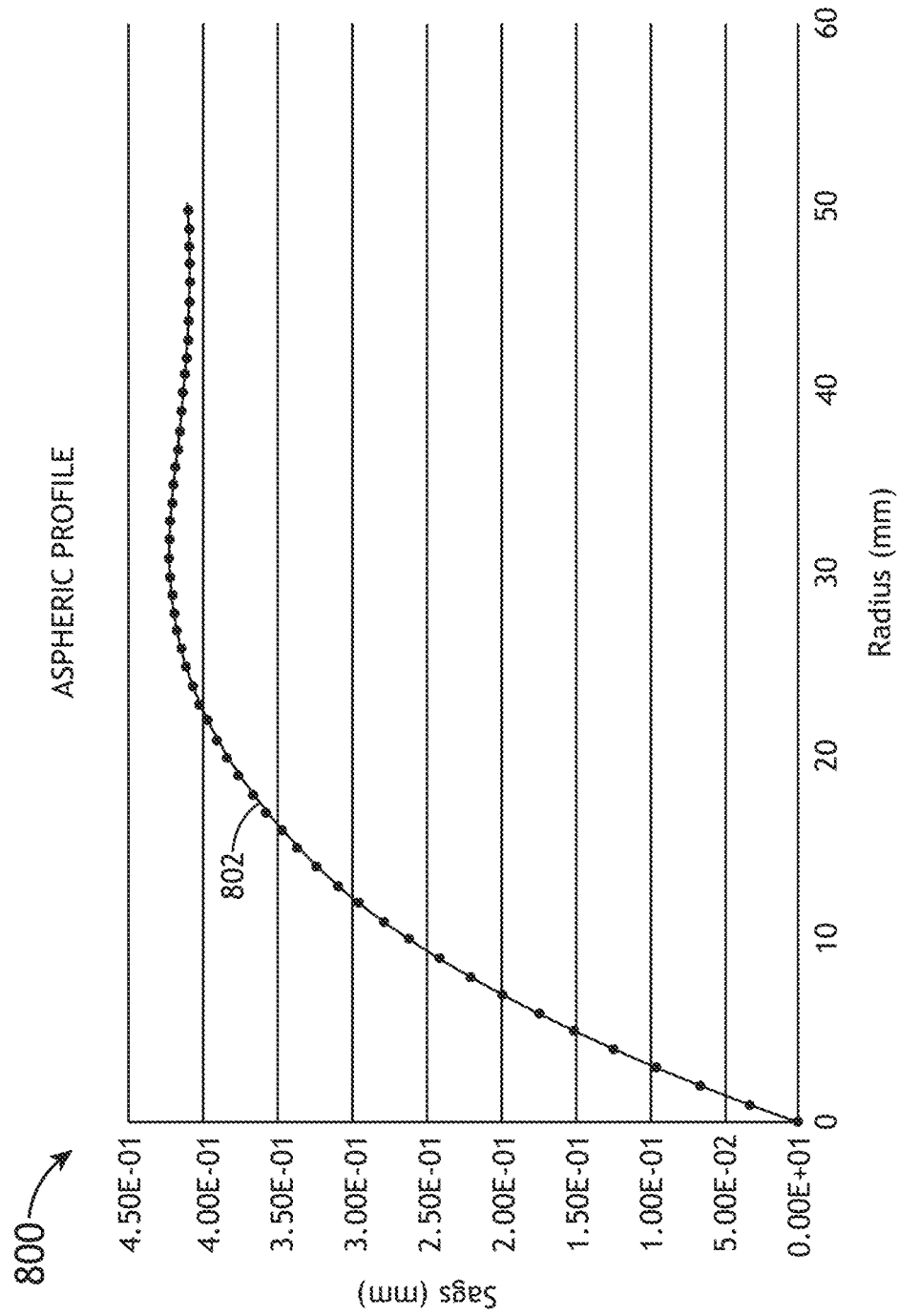
FIG. 8 illustrates a surface profile graph of an aspherical correction plate, in accordance with one or more embodiments of the present disclosure.
Figure 9A:
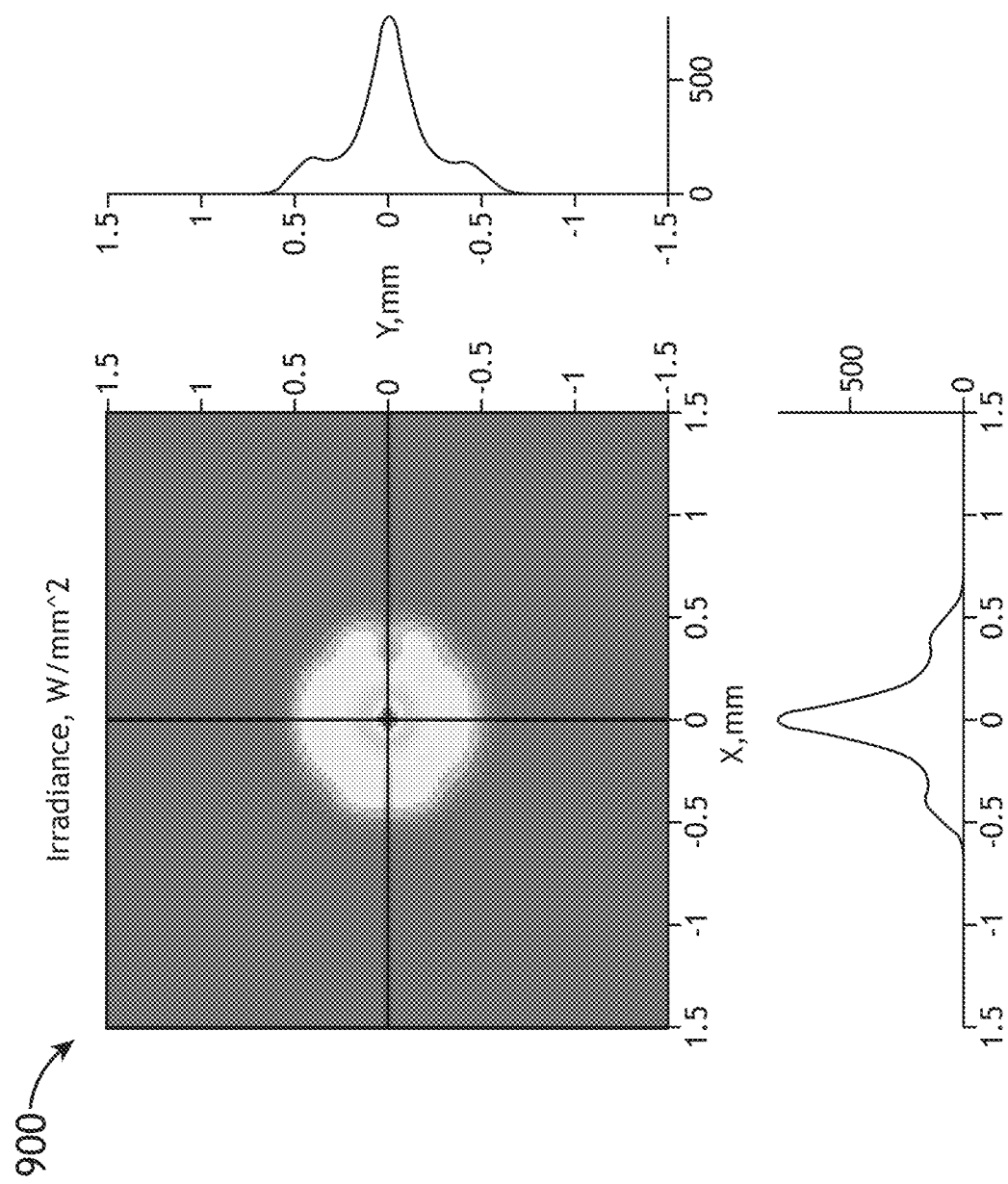
FIGS. 9A and 9B illustrate collection focus profile cross sections at the collection focus in a system with a prolate spheroid-shaped plasma lamp, in accordance with one or more embodiments of the present disclosure.
Figure 9B:
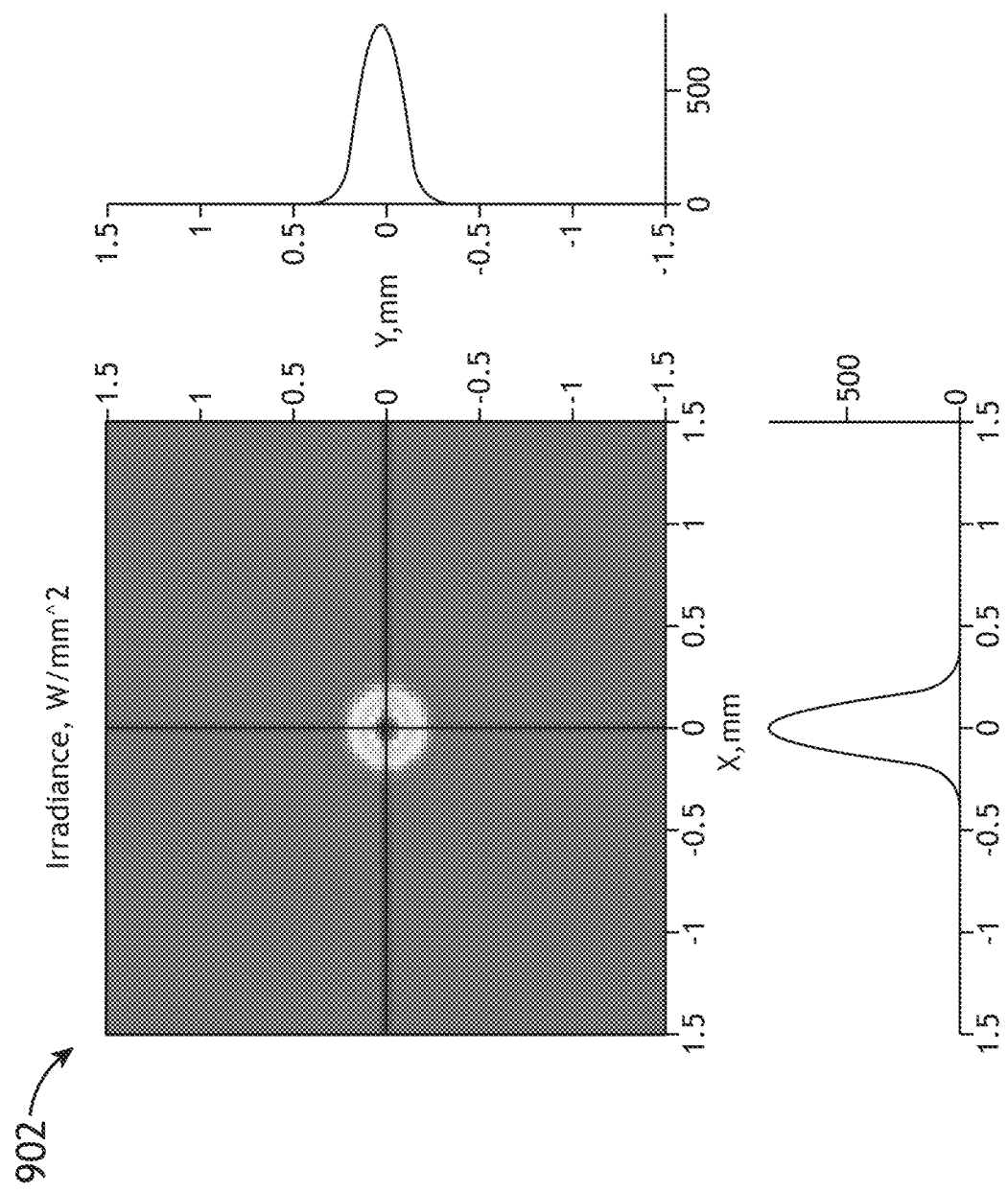

The benefits of an additional correction plate 132 to correct distortions and/or aberrations introduced in system 100 including a prolate spheroid-shaped plasma lamp 130 may be better understood with reference to FIGS. 8, 9A, and 9B.

FIG. 8 illustrates a surface profile graph 800 of an additional correction plate 132 (e.g., aspherical correction plate 132), in accordance with one or more embodiments of the present disclosure. In one example, curve 802 of graph 800 may illustrate the surface profile of additional correction plate 132 (e.g., aspherical correction plate 132). It is noted herein, however, that curve 802 is provided solely for illustration, and is not to be regarded as a limitation on the scope of the present disclosure, unless noted otherwise herein.

FIGS. 9A and 9B illustrate collection focus profile cross sections at the collection focus in a system 100 with a prolate spheroid-shaped plasma lamp 130, in accordance with one or more embodiments of the present disclosure. Graph 900, depicted in FIG. 9A, illustrates the collection focus profile cross section for a 20 μm plasma ball source, uncorrected by aspherical correction plate 132. Conversely, graph 902, depicted in FIG. 9B, illustrates the pumping focus profile cross section for the 20 μm plasma ball source corrected by aspherical correction plate 132.

Figure 10A:
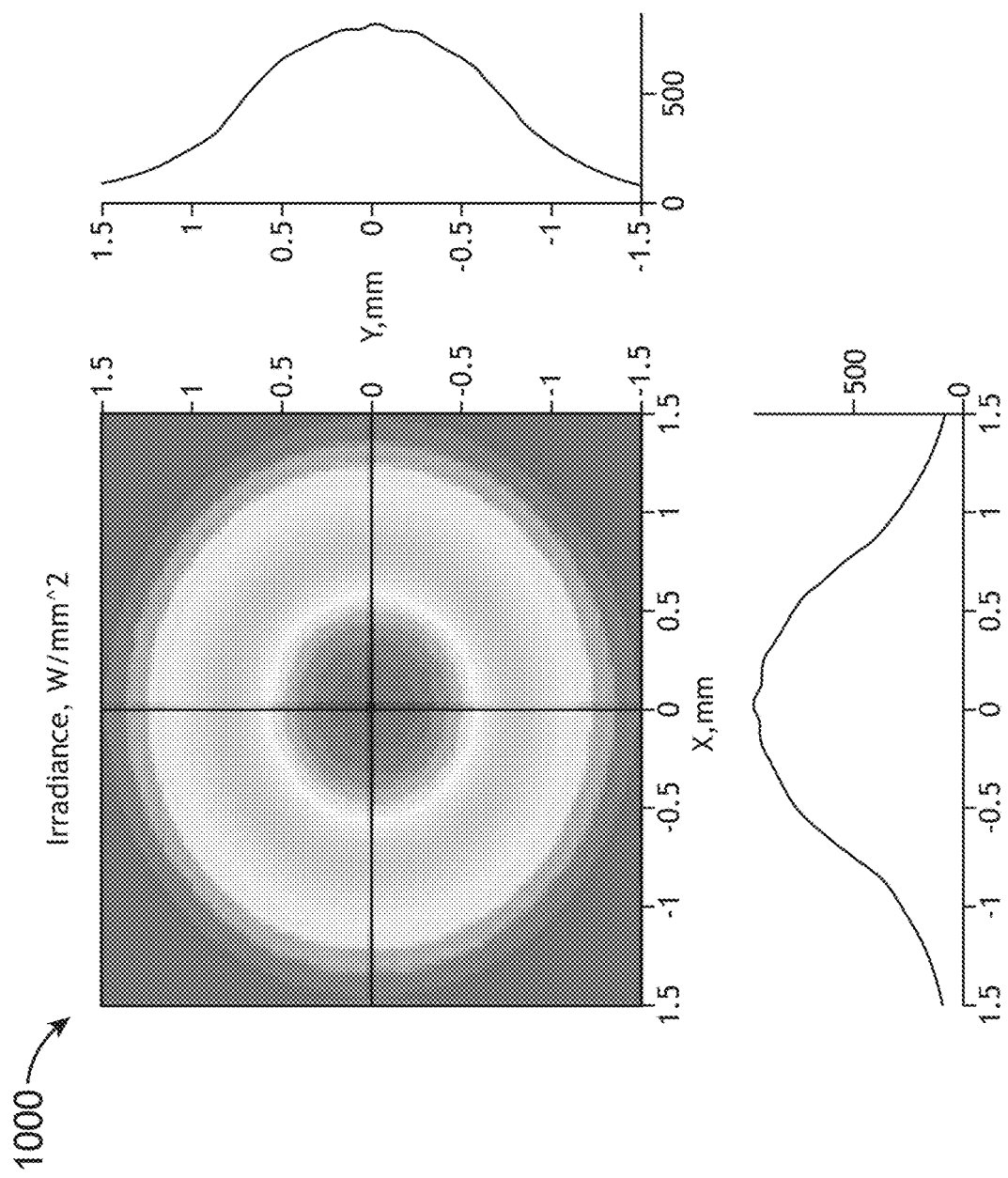
FIGS. 10A and 10B illustrate collection focus profile cross sections at the collection focus in a system with a prolate spheroid-shaped plasma lamp, in accordance with one or more embodiments of the present disclosure.
Figure 10B:
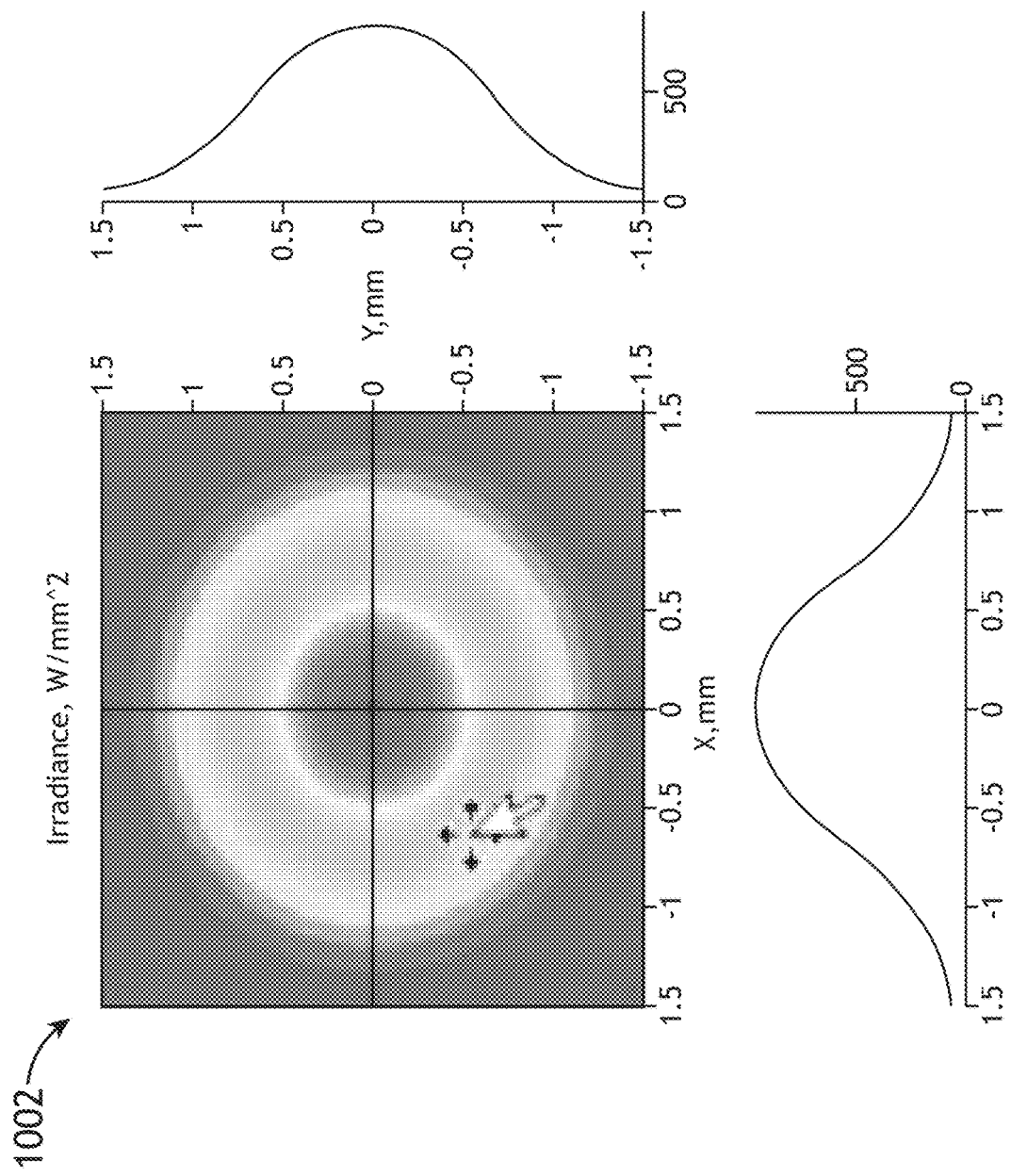

FIGS. 10A and 10B illustrate collection focus profile cross sections at the collection focus in a system with a prolate spheroid-shaped plasma lamp, in accordance with one or more embodiments of the present disclosure. Graph 1000, depicted in FIG. 10A, illustrates the collection focus profile cross section for a 200 μm plasma ball source, uncorrected by aspherical correction plate 132. Conversely, graph 1002, depicted in FIG. 10B, illustrates the pumping focus profile cross section for the 200 μm plasma ball source corrected by aspherical correction plate 132.

Comparing FIGS. 9A and 9B, as well as FIGS. 10A and 10B, it may be seen that correction of broadband illumination 107 along the collection path 105 may greatly improve the collection efficiency of system 100.

Figure 11:
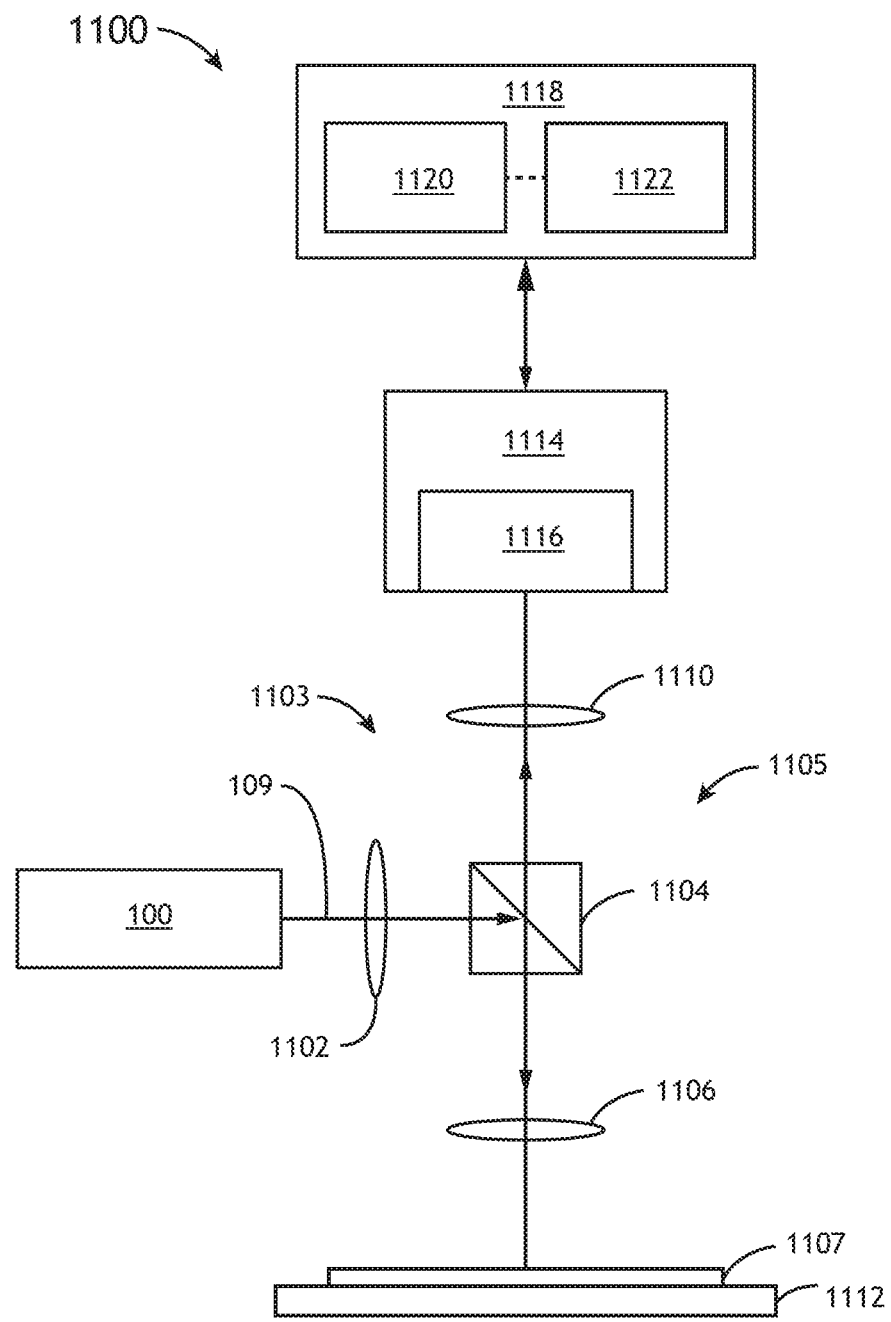
FIG. 11 illustrates a simplified schematic view of an optical characterization system implementing the plasma source with lamp house correction system, in accordance with one or more embodiments of the present disclosure.

FIG. 11 illustrates a simplified schematic view of an optical characterization system 1100 implementing plasma source lamp house correction system 100, in accordance with one or more embodiments of the present disclosure. In one embodiment, system 1100 includes system 100, an illumination arm 1103, a collection arm 205, a detector assembly 1114, and a controller 1118 including one or more processors 1120 and memory 1122.

It is noted herein that system 1100 may comprise any imaging, inspection, metrology, lithography, or other characterization system known in the art. In this regard, system 1100 may be configured to perform inspection, optical metrology, lithography, and/or any form of imaging on a specimen 1107. Specimen 1107 may include any sample known in the art including, but not limited to, a wafer, a reticle/photomask, and the like. It is noted that system 1100 may incorporate one or more of the various embodiments of system 100 described throughout the present disclosure.

In one embodiment, specimen 1107 is disposed on a stage assembly 1112 to facilitate movement of specimen 1107. Stage assembly 1112 may include any stage assembly 1112 known in the art including, but not limited to, an X-Y stage, an R-θ stage, and the like. In another embodiment, stage assembly 1112 is capable of adjusting the height of specimen 1107 during inspection or imaging to maintain focus on the specimen 1107.

In another embodiment, the illumination arm 1103 is configured to direct characterization illumination 109 from system 100 to the specimen 1107. The illumination arm 1103 may include any number and type of optical components known in the art. In one embodiment, the illumination arm 1103 includes one or more optical elements 1102, a beam splitter 1104, and an objective lens 1106. In this regard, illumination arm 1103 may be configured to focus characterization illumination 109 from system 100 onto the surface of the specimen 1107. The one or more optical elements 1102 may include any optical element or combination of optical elements known in the art including, but not limited to, one or more mirrors, one or more lenses, one or more polarizers, one or more gratings, one or more filters, one or more beam splitters, and the like.

In another embodiment, the collection arm 1105 is configured to collect light reflected, scattered, diffracted, and/or emitted from specimen 1107. In another embodiment, collection arm 1105 may direct and/or focus the light from the specimen 1107 to a sensor 1116 of a detector assembly 1114. It is noted that sensor 1116 and detector assembly 1114 may include any sensor and detector assembly known in the art. The sensor 1116 may include, but is not limited to, a charge-coupled device (CCD) detector, a complementary metal-oxide semiconductor (CMOS) detector, a time-delay integration (TDI) detector, a photomultiplier tube (PMT), an avalanche photodiode (APD), and the like. Further, sensor 1116 may include, but is not limited to, a line sensor or an electron-bombarded line sensor.

In another embodiment, detector assembly 1114 is communicatively coupled to a controller 1118 including one or more processors 1120 and memory 1122. For example, the one or more processors 1120 may be communicatively coupled to memory 1122, wherein the one or more processors 1120 are configured to execute a set of program instructions stored on memory 1122. In one embodiment, the one or more processors 1120 are configured to analyze the output of detector assembly 1114. In one embodiment, the set of program instructions are configured to cause the one or more processors 1120 to analyze one or more characteristics of specimen 1107. In another embodiment, the set of program instructions are configured to cause the one or more processors 1120 to modify one or more characteristics of system 1100 in order to maintain focus on the specimen 207 and/or the sensor 1116. For example, the one or more processors 1120 may be configured to adjust the objective lens 1106 or one or more optical elements 1102 in order to focus characterization illumination 109 from system 100 onto the surface of the specimen 1107. By way of another example, the one or more processors 1120 may be configured to adjust the objective lens 1106 and/or one or more optical elements 1110 in order to collect illumination from the surface of the specimen 1107 and focus the collected illumination on the sensor 1116.

It is noted that the system 1100 may be configured in any optical configuration known in the art including, but not limited to, a dark-field configuration, a bright-field orientation, and the like.

It is noted herein that the one or more components of system 1100 may be communicatively coupled to the various other components of system 1100 in any manner known in the art. For example, system 100, detector assembly 1114, controller 1118, and one or more processors 1120 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

Figure 12:
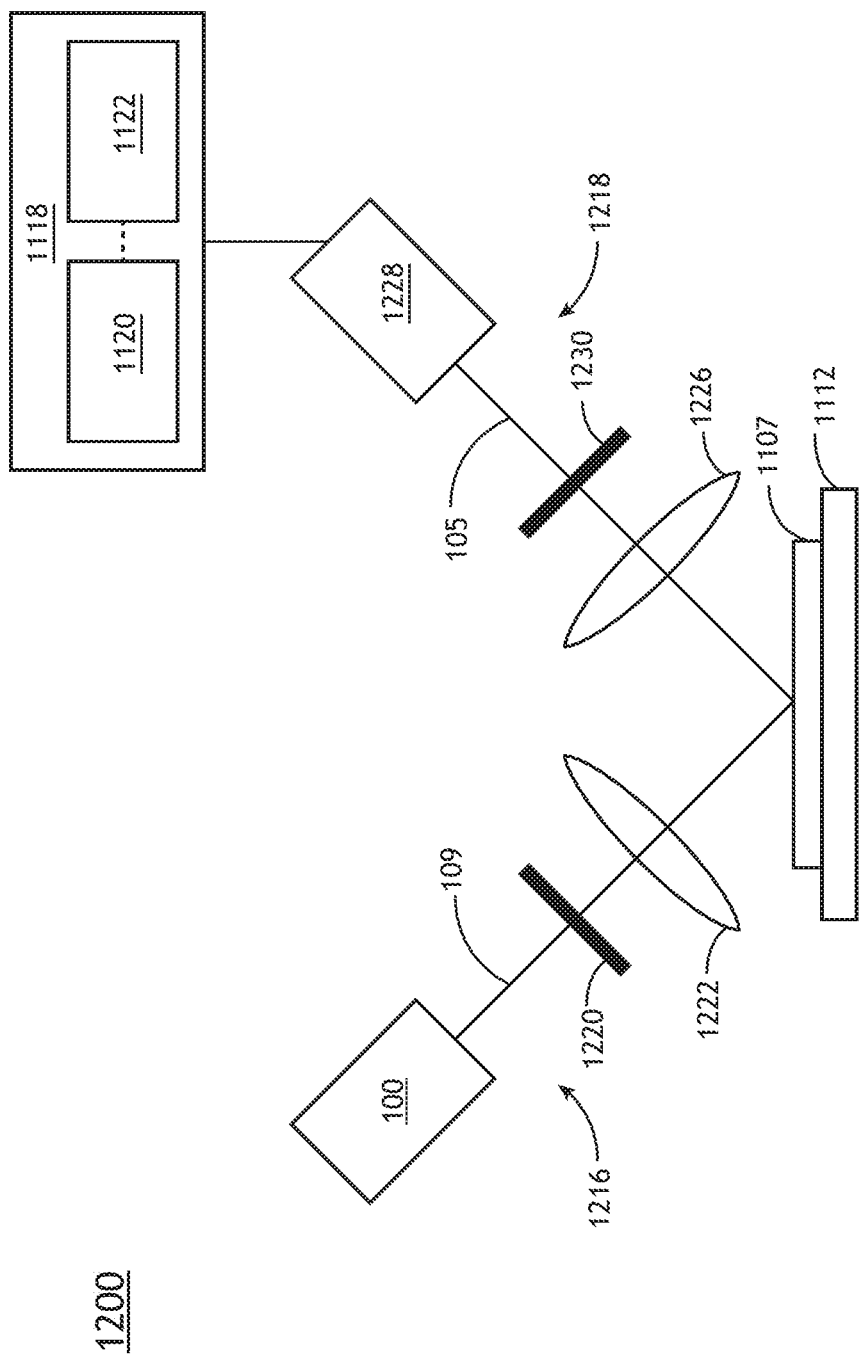
FIG. 12 illustrates a simplified schematic view of an optical characterization system implementing the plasma source with lamp house correction system, in accordance with one or more embodiments of the present disclosure.

FIG. 12 illustrates a simplified schematic diagram of an optical characterization system 1200 arranged in a reflectometry and/or ellipsometry configuration, in accordance with one or more embodiments of the present disclosure. It is noted that the various embodiments and components described with respect to FIG. 11 may be interpreted to extend to the system of FIG. 12. The system 1200 may include any type of metrology system known in the art.

In one embodiment, system 1200 includes system 100, an illumination arm 1116, a collection arm 1118, a detector assembly 1228, and the controller 1118 including the one or more processors 1120 and memory 1122.

In this embodiment, the characterization illumination 109 from system 100 is directed to the specimen 1107 via the illumination arm 1216. In another embodiment, the system 1200 collects radiation emanating from the sample via the collection arm 1218. The illumination arm pathway 1216 may include one or more beam conditioning components 1220 suitable for modifying and/or conditioning the characterization illumination 109. For example, the one or more beam conditioning components 1220 may include, but are not limited to, one or more polarizers, one or more filters, one or more beam splitters, one or more diffusers, one or more homogenizers, one or more apodizers, one or more beam shapers, or one or more lenses.

In another embodiment, the illumination arm 1216 may utilize a first focusing element 1222 to focus and/or direct the characterization illumination 109 onto the specimen 1107 disposed on the sample stage 1112. In another embodiment, the collection arm 1218 may include a second focusing element 1226 to collect radiation from the specimen 1107.

In another embodiment, the detector assembly 1228 is configured to capture radiation emanating from the specimen 1107 through the collection arm 1218. For example, the detector assembly 1228 may receive radiation reflected or scattered (e.g., via specular reflection, diffuse reflection, and the like) from the specimen 1107. By way of another example, the detector assembly 1228 may receive radiation generated by the specimen 1107 (e.g., luminescence associated with absorption of the beam, and the like). It is noted that detector assembly 1228 may include any sensor and detector assembly known in the art. The sensor may include, but is not limited to, CCD detector, a CMOS detector, a TDI detector, a PMT, an APD, and the like.

The collection arm 1218 may further include any number of collection beam conditioning elements 1230 to direct and/or modify illumination collected by the second focusing element 1226 including, but not limited to, one or more lenses, one or more filters, one or more polarizers, or one or more phase plates.

The system 1200 may be configured as any type of metrology tool known in the art such as, but not limited to, a spectroscopic ellipsometer with one or more angles of illumination, a spectroscopic ellipsometer for measuring Mueller matrix elements (e.g., using rotating compensators), a single-wavelength ellipsometer, an angle-resolved ellipsometer (e.g., a beam-profile ellipsometer), a spectroscopic reflectometer, a single-wavelength reflectometer, an angle-resolved reflectometer (e.g., a beam-profile reflectometer), an imaging system, a pupil imaging system, a spectral imaging system, or a scatterometer.

A description of an inspection/metrology tools suitable for implementation in the various embodiments of the present disclosure are provided in U.S. patent application Ser. No. 13/554,954, entitled "Wafer Inspection System," filed on Jul. 9, 2012; U.S. Published Patent Application 2009/0180176, entitled "Split Field Inspection System Using Small Catadioptric Objectives," published on Jul. 16, 2009; U.S. Published Patent Application 2007/0002465, entitled "Beam Delivery System for Laser Dark-Field Illumination in a Catadioptric Optical System," published on Jan. 4, 2007; U.S. Pat. No. 5,999,310, entitled "Ultra-broadband UV Microscope Imaging System with Wide Range Zoom Capability," issued on Dec. 7, 1999; U.S. Pat. No. 7,525,649 entitled "Surface Inspection System Using Laser Line Illumination with Two Dimensional Imaging," issued on Apr. 28, 2009; U.S. Published Patent Application 2013/0114085, entitled "Dynamically Adjustable Semiconductor Metrology System," by Wang et al. and published on May 9, 2013; U.S. Pat. No. 5,608,526, entitled "Focused Beam Spectroscopic Ellipsometry Method and System, by Piwonka-Corle et al., issued on Mar. 4, 1997; and U.S. Pat. No. 6,297,880, entitled "Apparatus for Analyzing Multi-Layer Thin Film Stacks on Semiconductors," by Rosencwaig et al., issued on Oct. 2, 2001, which are each incorporated herein by reference in their entirety.

The one or more processors 1120 of the present disclosure may include any one or more processing elements known in the art. In this sense, the one or more processors 1120 may include any microprocessor-type device configured to execute software algorithms and/or instructions. It should be recognized that the steps described throughout the present disclosure may be carried out by a single computer system or, alternatively, multiple computer systems. In general, the term "processor" may be broadly defined to encompass any device having one or more processing and/or logic elements, which execute program instructions from a non-transitory memory medium 1122. Moreover, different subsystems of the various systems disclosed may include processor and/or logic elements suitable for carrying out at least a portion of the steps described throughout the present disclosure.

The memory medium 1122 may include any storage medium known in the art suitable for storing program instructions executable by the associated one or more processors 1120. For example, the memory medium 1122 may include a non-transitory memory medium. For instance, the memory medium 1122 may include, but is not limited to, a read-only memory, a random access memory, a magnetic or optical memory device (e.g., disk), a magnetic tape, a solid state drive, and the like. In another embodiment, the memory 1122 is configured to store one or more results and/or outputs of the various steps described herein. It is further noted that memory 1122 may be housed in a common controller housing with the one or more processors 1120. In an alternative embodiment, the memory 1122 may be located remotely with respect to the physical location of the one or more processors 1120. For instance, the one or more processors 1120 may access a remote memory (e.g., server), accessible through a network (e.g., internet, intranet, and the like). In this regard, the one or more processors 112-of the controller 1118 may execute any of the various process steps described throughout the present disclosure.

In some embodiments, systems 100, 1100, and 1200, as described herein, may be configured as a "stand alone tool," interpreted herein as a tool that is not physically coupled to a process tool. In other embodiments, such an inspection or metrology system may be coupled to a process tool (not shown) by a transmission medium, which may include wired and/or wireless portions. The process tool may include any process tool known in the art such as a lithography tool, an etch tool, a deposition tool, a polishing tool, a plating tool, a cleaning tool, or an ion implantation tool. The results of inspection or measurement performed by the systems described herein may be used to alter a parameter of a process or a process tool using a feedback control technique, a feedforward control technique, and/or an in-situ control technique. The parameter of the process or the process tool may be altered manually or automatically.

The embodiments of the systems 100, 1100, and 1200 may be further configured as described herein. In addition, systems 100, 1100, and 1200 may be configured to perform any other step(s) of any of the method embodiment(s) described herein.

Figure 13:
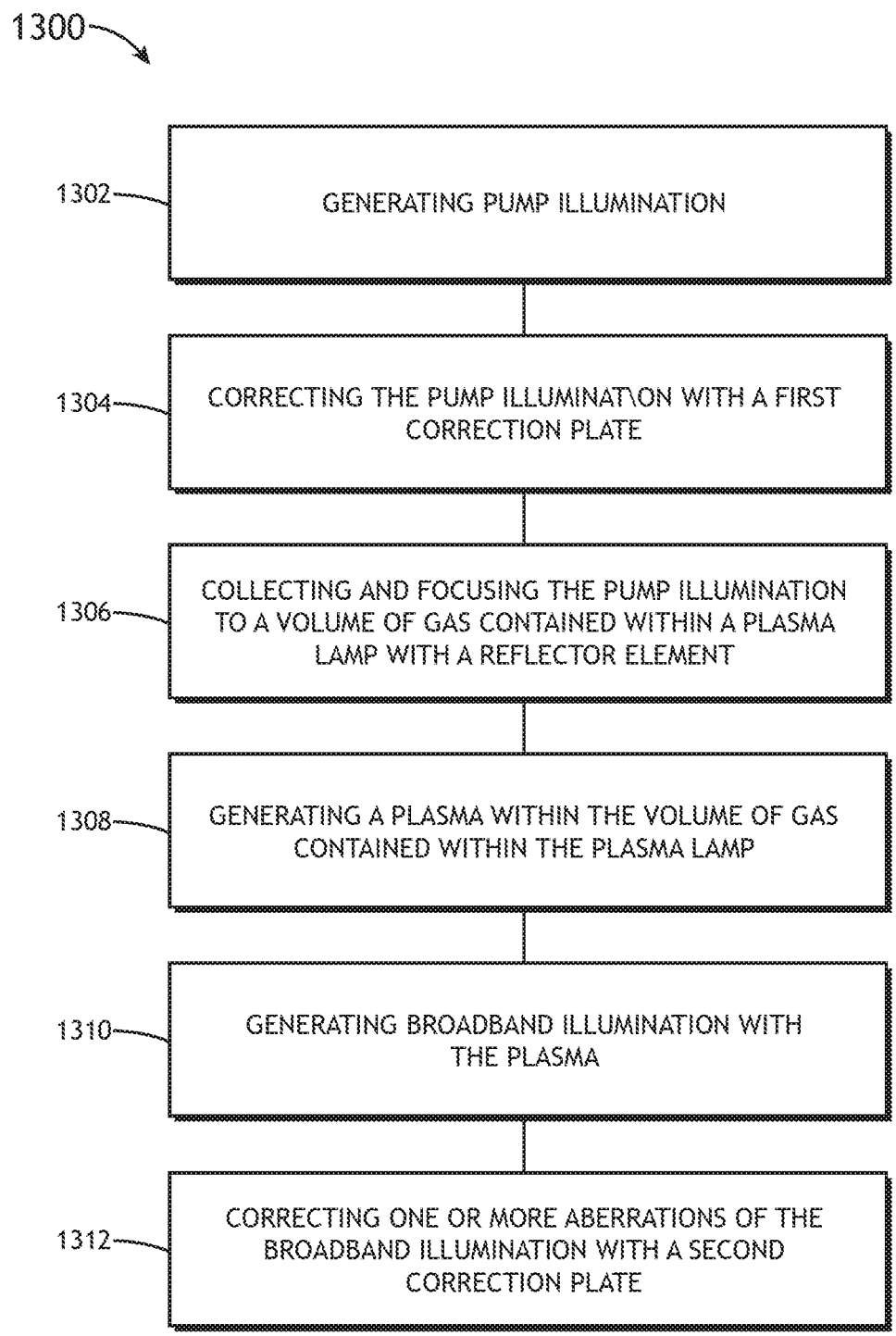
FIG. 13 illustrates a flowchart of a method for correcting errors induced by a plasma source lamp house, in accordance with one or more embodiments of the present disclosure.

FIG. 13 illustrates a flowchart of a method 1300 for correcting errors induced by a plasma source lamp house, in accordance with one or more embodiments of the present disclosure. It is noted herein that the steps of method 1300 may be implemented all or in part by system 100. It is further recognized, however, that the method 1300 is not limited to the system 100 in that additional or alternative system-level embodiments may carry out all or part of the steps of method 1300.

In a step 1302, pump illumination is generated. For example, pump source 102 may be configured to generate pump illumination 101 and direct the pump illumination 101 along a pumping path 103. Pump source 102 may include any illumination source configured to pump plasma known in the art including, but not limited to, one or more lasers, one or more fiber lasers, one or more infrared (IR) lasers, and the like.

In a step 1304, the pump illumination is corrected with a first correction plate. For example, pump illumination 101 may be corrected by a cylindrical correction plate 108, as illustrated in FIG. 1A. By way of another example, pump illumination 101 may be corrected by an aspherical correction plate 128. As noted previously herein, correction of the pump illumination 101 by a correction plate (e.g., correction plates 108, 128) may be carried out to correct for one or more aberrations introduced by one or more optical elements of the system 100 including, but not limited to, the plasma lamp 112, 130.

In a step 1306, the pump illumination is collected and focused with a reflector element to a volume of gas contained within a plasma lamp. For example, the reflector element 110 may be configured to receive pump illumination 101 and direct the pump illumination 101 to a volume of gas contained within the plasma lamp 112. The reflector element 110 may include an elliptical reflector element. Furthermore, the reflector element 110 may include an aspherical reflector element 110. The plasma lamp 112 may take any shape known in the art for containing a volume of gas. For example, as shown in FIG. 1A, the plasma lamp 112 may include a cylindrical plasma lamp 112. By way of another example, the plasma lamp may include a prolate spheroid-shaped plasma lamp 130, as shown in FIG. 1B. Plasma lamps 112, 130 may contain a volume of gas including any gas or mixture of gasses known in the art suitable for generating a plasma including, but not limited to, xenon (Xe), argon (Ar), and the like. In one embodiment, the volume of gas contained within the plasma lamps 112, 130 may be contained at a high pressure. For instance, the volume of gas within plasma lamps 112, 130 may be at 10 atm.

In a step 1308, a plasma is generated within the volume of gas contained within the plasma lamp. As the reflector element 110 collects and focuses pump illumination 110 into the volume of gas contained within the plasma lamp 112, 130, a plasma 114 may be generated within the volume of gas.

In a step 1310, broadband illumination is generated by the plasma. Broadband illumination 107 may include illumination/radiation of various wavelengths including, but not limited to, ultraviolet (UV) radiation, deep ultraviolet (DUV) radiation, vacuum ultraviolet (VUV) radiation, and the like.

In a step 1312, one or more aberrations of the broadband illumination are corrected with a second correction plate. For example, broadband illumination 107 may be directed to an additional correction plate 118, 132, wherein the additional correction plate 118, 132 is configured to correct one or more aberrations of the broadband illumination 107. In some embodiments, additional correction plate 118, 132 includes an aspherical correction plate.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
   a pump source configured to generate pump illumination;
   a correction plate configured to receive the pump illumination and modify one or more characteristics of the pump illumination in order to correct one or more aberrations of the pump illumination introduced by one or more optical elements of the system; and a reflector element configured to receive the pump illumination and direct the pump illumination to a volume of gas contained within a plasma lamp, wherein the plasma lamp is configured to sustain a plasma within the volume of gas to generate broadband illumination.

2. The system of claim 1, wherein the plasma lamp comprises a cylindrical plasma lamp.

3. The system of claim 1, wherein the reflector element comprises an aspherical reflector element.

4. The system of claim 3, wherein the surface profile of the aspherical reflector element is described by the equation $$z = \frac{cr^2}{1+\sqrt{1-(1+k)c^2r^2}} + \sum_{i=1}^{n} a_i r^i.$$

5. The system of claim 1, wherein the plasma lamp comprises a substantially prolate spheroid-shaped plasma lamp.

6. The system of claim 1, wherein the correction plate comprises an aspherical correction plate configured to correct one or more aberrations of the pump illumination introduced by the plasma lamp.

7. The system of claim 6, wherein the surface profile of the correction plate is described by the equation $$z = \frac{cr^2}{1+\sqrt{1-(1+k)c^2r^2}} + \sum_{i=1}^{n} a_i r^i.$$

8. The system of claim 1, further comprising a compensator plate configured to receive the pump illumination and direct the pump illumination toward the reflector element.

9. The system of claim 1, further comprising the one or more optical elements and a homogenizer, wherein the one or more optical elements are configured to receive the broadband illumination from the plasma lamp and direct the broadband illumination to the homogenizer.

10. The system of claim 1, wherein the pump source comprises a fiber laser pump source.

11. The system of claim 1, further comprising a cold mirror configured to receive the broadband illumination and direct the broadband illumination to a second correction plate.

12. The system of claim 1, wherein the correction plate comprises a first correction plate and a second correction plate, wherein the first correction plate includes one or more odd aspheric correction terms, and the second correction plate includes one or more cylindrical correction terms.

13. The system of claim 1, wherein the correction plate includes a surface having one or more odd aspheric correction terms and one or more cylindrical correction terms.

14. A system, comprising:
a broadband illumination source, wherein the broadband illumination source comprises:
  a pump source configured to generate pump illumination;
  a correction plate configured to receive the pump illumination and modify one or more characteristics of the pump illumination; and
  a reflector element configured to receive the pump illumination and direct the pump illumination to a volume of gas contained within a plasma lamp, wherein the plasma lamp is configured to sustain a plasma within the volume of gas to generate broadband illumination;
a detector assembly; and
a set of characterization optics configured to collect at least a portion of the broadband illumination from the broadband illumination source and direct the broadband illumination onto a sample, wherein the set of characterization optics is further configured to direct radiation from the sample to the detector assembly.

15. A system, comprising:
a pump source configured to generate pump illumination;
a first correction plate configured to receive the pump illumination and modify one or more characteristics of the pump illumination;
a reflector element configured to receive the pump illumination and direct the pump illumination to a volume of gas contained within a plasma lamp, wherein the plasma lamp is configured to sustain a plasma within the volume of gas to generate broadband illumination; and
a second correction plate configured to receive the broadband illumination and correct one or more aberrations of the broadband illumination, wherein the second correction plate comprises an aspherical correction plate.

16. The system of claim 15, wherein the surface profile of the second correction plate is described by the equation $$z = \frac{cr^2}{1+\sqrt{1-(1+k)c^2r^2}} + \sum_{i=1}^{n} a_i r^i.$$

17. A system, comprising:
a broadband illumination source, wherein the broadband illumination source comprises:
  a pump source configured to generate pump illumination;
  a first correction plate configured to receive the pump illumination and modify one or more characteristics of the pump illumination;
  a reflector element configured to receive the pump illumination and direct the pump illumination to a volume of gas contained within a plasma lamp, wherein the plasma lamp is configured to sustain a plasma within the volume of gas to generate broadband illumination; and
  a second correction plate configured to receive the broadband illumination and correct one or more aberration of the broadband illumination, wherein the second correction plate comprises an aspherical correction plate;
a detector assembly; and
a set of characterization optics configured to collect at least a portion of the broadband illumination from the broadband illumination source and direct the broadband illumination onto a sample, wherein the set of characterization optics is further configured to direct radiation from the sample to the detector assembly.

18. A method, comprising:
generating pump illumination;
correcting the pump illumination with a first correction plate;

collecting and focusing the pump illumination to a volume of gas contained within a plasma lamp with a reflector element;
generating a plasma within the volume of gas contained within the plasma lamp;
generating broadband illumination with the plasma; and
correcting one or more aberrations of the broadband illumination with a second correction plate.

19. The method of claim 18, wherein the plasma lamp comprises a cylindrical plasma lamp.

20. The method of claim 18, wherein the reflector element comprises an aspherical reflector element.

21. The method of claim 18, wherein the surface profile of the reflector element is described by the equation $$z = \frac{cr^2}{1+\sqrt{1-(1+k)c^2r^2}} + \sum_{i=1}^{n} a_i r^i.$$

22. The method of claim 18, wherein the plasma lamp comprises a substantially prolate spheroid-shaped plasma lamp.

23. The method of claim 18, wherein the first correction plate comprises an aspherical correction plate configured to correct one or more aberrations of the pump illumination introduced by the plasma lamp.

24. The method of claim 23, wherein the surface profile of the first correction plate is described by the equation $$z = \frac{cr^2}{1+\sqrt{1-(1+k)c^2r^2}} + \sum_{i=1}^{n} a_i r^i.$$

25. The method of claim 18, further comprising compensating the pump illumination with a compensator plate.

26. The method of claim 18, further comprising directing the broadband illumination to a homogenizer via one or more optical elements.

27. The method of claim 18, wherein the generating pump illumination comprises generating pump illumination with a fiber laser pump source.

* * * * *